US011637160B2

(12) United States Patent
Lee et al.

(10) Patent No.: US 11,637,160 B2
(45) Date of Patent: Apr. 25, 2023

(54) DISPLAY APPARATUS

(71) Applicant: Samsung Display Co., Ltd., Yongin-Si (KR)

(72) Inventors: Jaehun Lee, Yongin-si (KR); Jungi Kim, Yongin-si (KR); Junho Sim, Yongin-si (KR); Yangho Jung, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 84 days.

(21) Appl. No.: 17/382,261

(22) Filed: Jul. 21, 2021

(65) Prior Publication Data
US 2022/0165804 A1    May 26, 2022

(30) Foreign Application Priority Data

Nov. 20, 2020  (KR) ................. 10-2020-0156921

(51) Int. Cl.
*H01L 27/32* (2006.01)
(52) U.S. Cl.
CPC ................. *H01L 27/326* (2013.01)
(58) Field of Classification Search
CPC .................................................. H01L 27/326
See application file for complete search history.

(56) References Cited

U.S. PATENT DOCUMENTS

| | | | |
|---|---|---|---|
| 2016/0181350 A1* | 6/2016 | Lee | H01L 51/5212 438/34 |
| 2017/0125448 A1* | 5/2017 | Park | G02F 1/133512 |
| 2017/0338292 A1 | 11/2017 | Choi et al. | |
| 2021/0241680 A1* | 8/2021 | Ock | G09G 3/32 |
| 2021/0335924 A1* | 10/2021 | Bai | H01L 51/5293 |
| 2021/0376007 A1* | 12/2021 | Choi | H01L 27/3227 |
| 2021/0399060 A1* | 12/2021 | Seo | H01L 27/3272 |
| 2022/0077265 A1* | 3/2022 | Ma | H01L 27/3276 |
| 2022/0102421 A1* | 3/2022 | Yang | H01L 27/3218 |
| 2022/0123270 A1* | 4/2022 | Lee | H01L 27/326 |
| 2022/0139336 A1* | 5/2022 | Jeon | G09G 3/3291 345/694 |
| 2022/0310706 A1* | 9/2022 | Yi | H01L 27/3218 |

FOREIGN PATENT DOCUMENTS

| | | |
|---|---|---|
| CN | 110504289 A | 11/2019 |
| CN | 110767710 A | 2/2020 |
| KR | 10-1701368 B1 | 2/2017 |
| KR | 10-2017-0130019 A | 11/2017 |

* cited by examiner

*Primary Examiner* — Douglas M Menz
(74) *Attorney, Agent, or Firm* — Innovation Counsel LLP

(57) ABSTRACT

A display apparatus includes: a substrate including a first area, a second area, and a third area that is between the first area and the second area; a plurality of first to third display elements respectively arranged in the first to third areas, each of the plurality of first to third display elements including a pixel electrode; and an insulating layer including a plurality of first to third openings that respectively expose at least portions of the pixel electrodes of the plurality of first to third display elements. A number of the plurality of first openings is greater than a number of the plurality of second openings per unit area. In a plan view, an area of the plurality of first openings is greater than an area of the plurality of third openings.

20 Claims, 17 Drawing Sheets

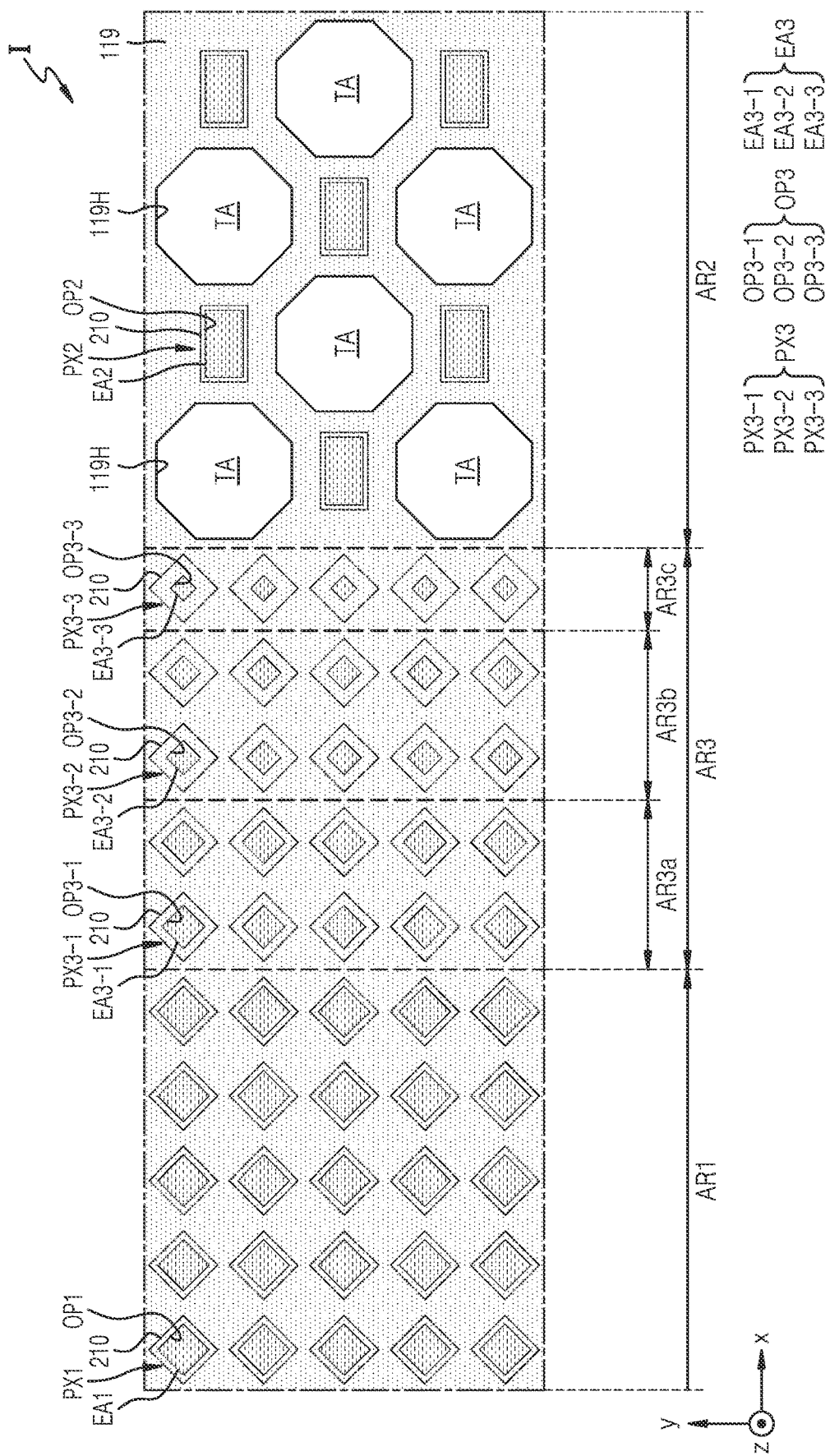

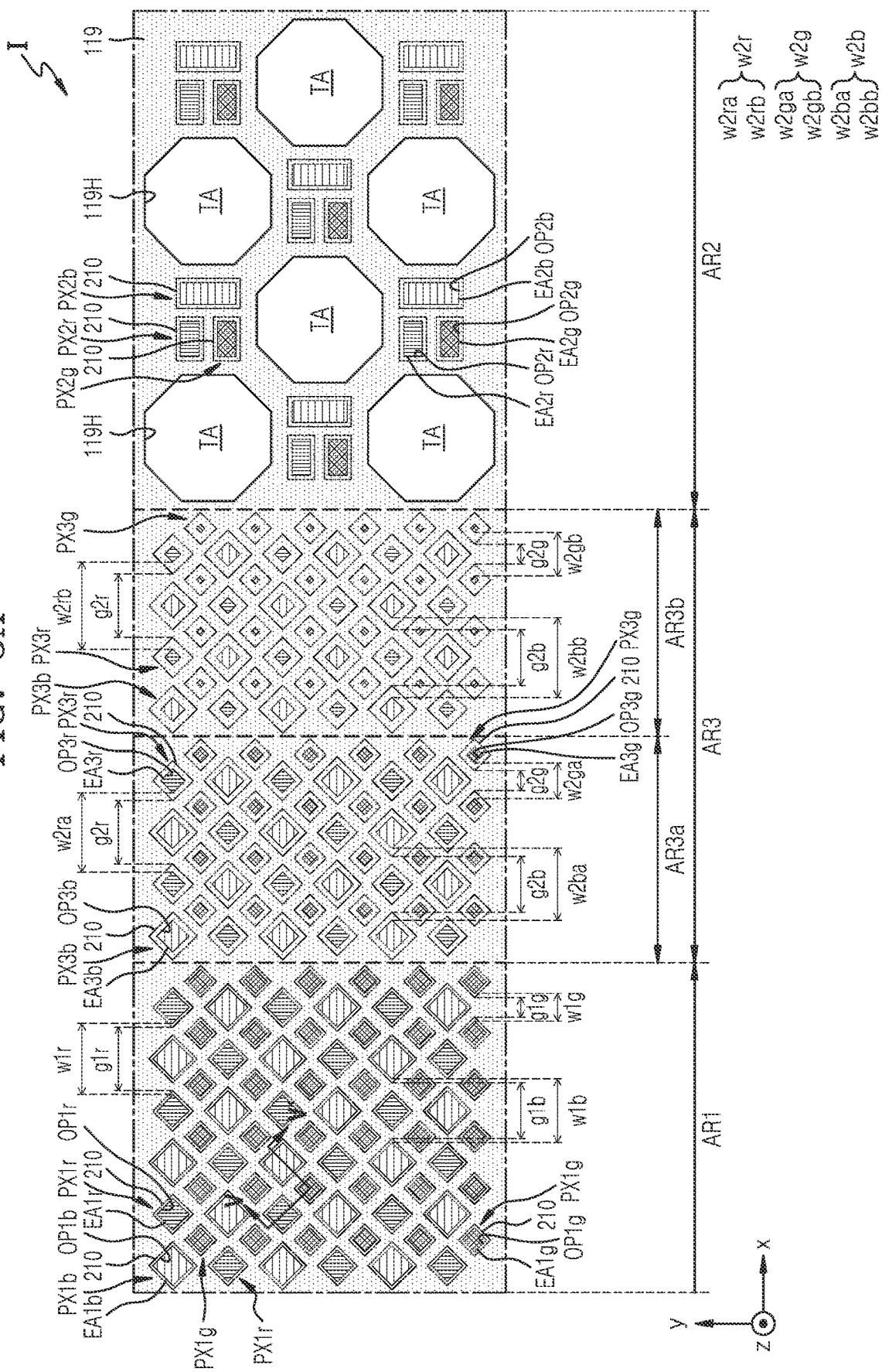

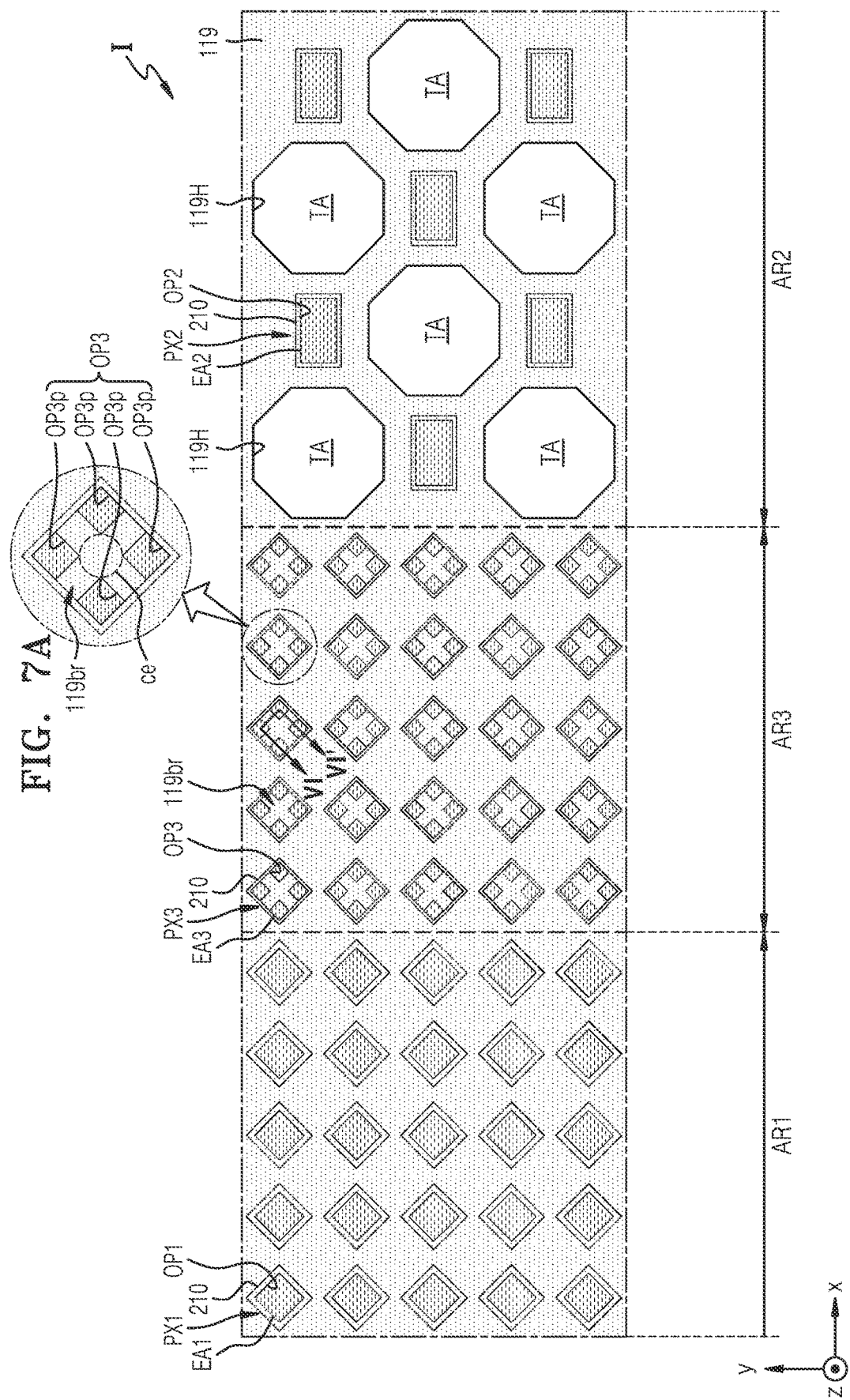

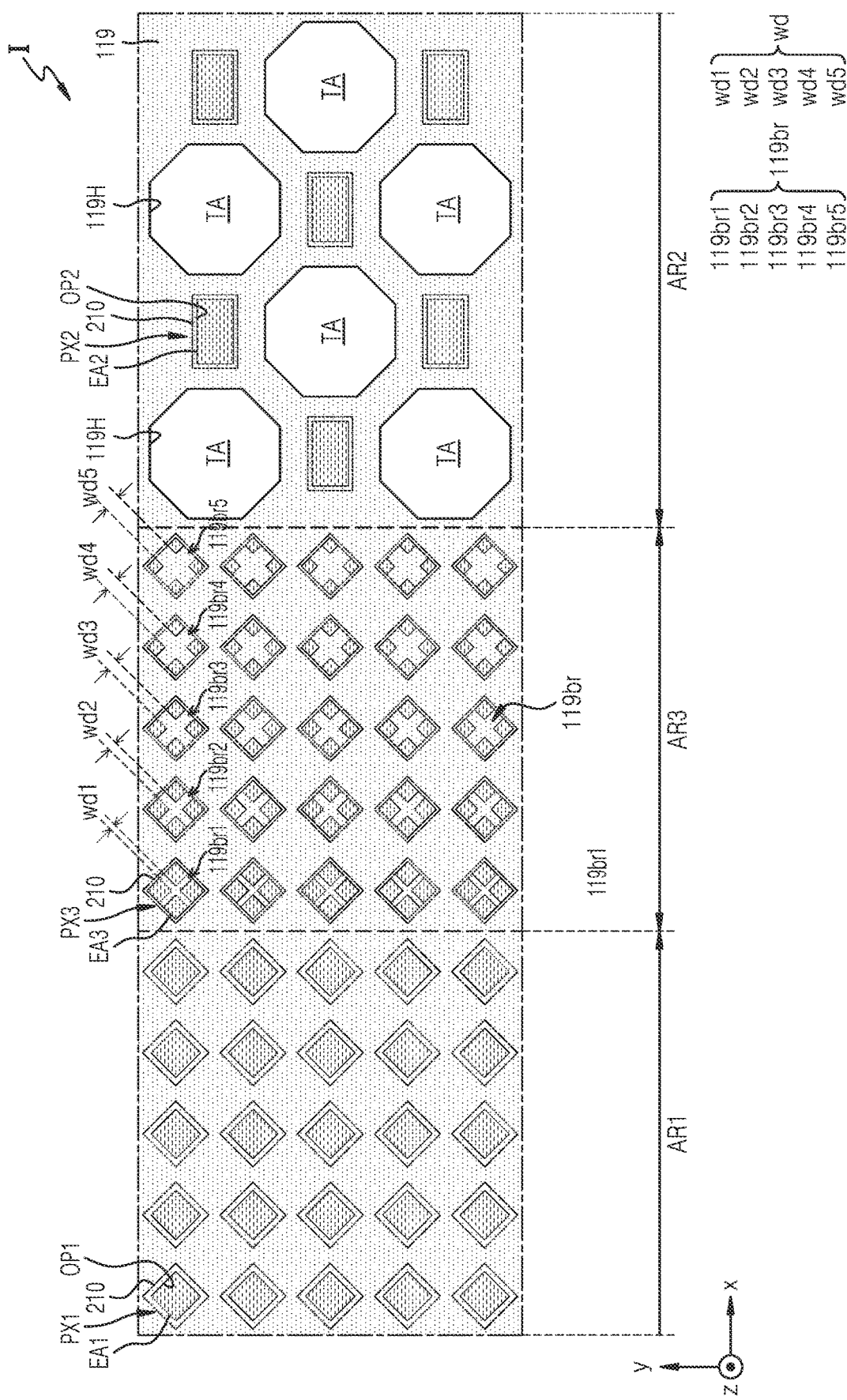

DISPLAY APPARATUS

CROSS-REFERENCE TO RELATED APPLICATION

This application claims priority under 35 U.S.C. § 119 to Korean Patent Application No. 10-2020-0156921, filed on Nov. 20, 2020, in the Korean Intellectual Property Office, the disclosure of which is incorporated by reference herein in its entirety.

BACKGROUND

1. Field

The present disclosure relates to a display apparatus.

2. Description of the Related Art

Recently, the usage of display apparatuses has been diversified with the advancement of the technologies. Also, display apparatuses have become thinner and lighter, and the usage of display apparatuses has been expanded for various applications.

While increasing a display area of display apparatuses, components are added to the display apparatuses to impart various functionalities. In order to increase a display area and add various functionalities, studies have been conducted to implement those functionalities into the display area of a display apparatus in addition to displaying an image.

SUMMARY

The present disclosure provides a display device including pixels arranged in a display area to add various functionalities. According to one embodiment, a display apparatus has a structure of pixels arranged in a display area to reduce luminance difference between portions of the display area.

Additional aspects of the present disclosure will be set forth in part in the detailed description and, in part, will be apparent from the description, or may be learned by practice of the embodiments presented herein.

According to one embodiment, a display apparatus includes a substrate that includes a first area, a second area, and a third area that is between the first area and the second area, a plurality of display elements including a plurality of first display elements arranged in the first area, a plurality of second display elements arranged in the second area, and a plurality of third display elements arranged in the third area, each of the plurality of display elements including a pixel electrode, a first intermediate layer, and an opposite electrode, and an insulating layer including a plurality of openings that includes a plurality of first openings, a plurality of second openings, and a plurality of third openings that respectively expose at least portions of a plurality of pixel electrodes of the plurality of first to third display elements, wherein a number of the plurality of first openings is greater than a number of the plurality of second openings per unit area, and in a plan view, an area of the plurality of first openings is greater than an area of the plurality of third openings.

According to an embodiment, a first width of a first portion of the insulating layer between the plurality of first openings adjacent to each other in a direction may be less than a second width of a second portion of the insulating layer between the plurality of third openings adjacent to each other in the direction.

According to an embodiment, a first gap between the plurality of pixel electrodes of the plurality of first display elements adjacent to each other in the direction may be substantially equal to a second gap between the plurality of pixel electrodes of the plurality of third display elements adjacent to each other in the direction.

According to an embodiment, the third area may include a first portion and a second portion, in the plan view, an area of $(3\text{-}1)^{th}$ openings in the first portion of the third area may be greater than an area of $(3\text{-}2)^{th}$ openings in the second portion of the third area, and the second portion of the third area may be closer to the second area than the first portion of the third area.

According to an embodiment, in the plan view, an area of the plurality of third openings may gradually decrease from the first area toward the second area.

According to an embodiment, each of the plurality of third openings may include a plurality of partial openings, and the insulating layer may include a plurality of branches between the plurality of partial openings.

According to an embodiment, centers of the plurality of pixel electrodes of the plurality of third display elements may respectively overlap the plurality of branches.

According to an embodiment, in the plan view, a width of the plurality of branches may gradually increases from the first area toward the second area.

According to an embodiment, the plurality of display elements may further include a plurality of fourth display elements arranged in the first area and a plurality of fifth display elements arranged in the third area, each of the plurality of fourth display elements and the plurality of fifth display elements may include the pixel electrode, a second intermediate layer configured to emit light of a second color that is different from a first color that the first intermediate layer emits, and the opposite electrode, wherein the plurality of first display elements and the plurality of fourth display elements may be alternately arranged in the first area in a direction, and the plurality of third display elements and the plurality of fifth display elements may be alternately arranged in the third area in the direction.

According to an embodiment, the plurality of openings may further include a plurality of fourth openings and a plurality of fifth openings that respectively expose at least portions of the plurality of pixel electrodes of the plurality of fourth display elements and the plurality of fifth display elements, and in the plan view, an area of the plurality of fourth openings may be greater than an area of the plurality of fifth openings.

According to an embodiment, in the plan view, an area of the plurality of fifth openings may gradually decreases from the first area toward the second area.

According to an embodiment, in the second area, the insulating layer may further include a plurality of holes that exposes at least a portion of the substrate.

According to an embodiment, the plurality of holes may be respectively arranged between the plurality of second openings adjacent to each other.

According to an embodiment, the insulating layer may include chromium (Cr), chromium oxide ($Cr_xO_y$), $Cr/Cr_xO_y$, $Cr/Cr_xO_y$/chromium nitride ($CrN_y$), a carbon pigment, a red/green/blue (RGB)-mixed pigment, graphite, a non-Cr-based pigment, a lactam-based pigment, or a perylene-based pigment.

According to one embodiment, a display apparatus includes a substrate that includes a first area, a second area, and a third area that is between the first area and the second area, a plurality of pixel circuits arranged in the first area, the second area, and the third area, a plurality of pixel electrodes electrically connected to the plurality of pixel circuits and including a plurality of first pixel electrodes in the first area, a plurality of second pixel electrodes in the second area, and a plurality of third pixel electrodes in the third area, an insulating layer including a plurality of openings that includes a plurality of first openings and a plurality of second openings that respectively expose at least portions of the plurality of first pixel electrodes and the plurality of second pixel electrodes and arranged to cover at least one of the plurality of third pixel electrodes, an intermediate layer arranged in the plurality of first openings and the plurality of second openings, and an opposite electrode arranged on the intermediate layer, wherein a number of the plurality of first openings is greater than a number of the plurality of second openings per unit area.

According to an embodiment, the insulating layer may further include a plurality of third openings that exposes at least portions of the plurality of third pixel electrodes and covers other portions of the plurality of third pixel electrodes, and in a plan view, an area of the plurality of first openings may be substantially equal to an area of the plurality of third openings.

According to an embodiment, a number of the plurality of first pixel electrodes may be substantially equal to a number of the plurality of third pixel electrodes per unit area.

According to an embodiment, the third area may include a first portion and a second portion, a number of the plurality of third pixel electrodes covered by the insulating layer in the second portion of the third area may be greater than a number of the plurality of third pixel electrodes covered by the insulating layer in the first portion of the third area per unit area, and the second portion of the third area may be closer to the second area than the first portion of the third area.

According to an embodiment, a number of the plurality of third pixel electrodes are covered by the insulating layer per unit area may gradually increase from the first area toward the second area.

According to an embodiment, in the second area, the insulating layer may include a plurality of holes that exposes at least a portion of the substrate, and the plurality of holes may be respectively arranged between the plurality of second openings adjacent to each other.

Other aspects, features, and advantages of the present disclosure will become better understood through the accompanying drawings, the claims, and the detailed description.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 4 is an enlarged plan view of a portion of a display apparatus, according to another embodiment;

FIG. 5A is an enlarged plan view of a portion of a display apparatus, according to another embodiment;

FIG. 7A is an enlarged plan view of a portion of a display apparatus, according to another embodiment;

FIG. 8 is an enlarged plan view of a portion of a display apparatus, according to another embodiment;

DETAILED DESCRIPTION

Figure 1:
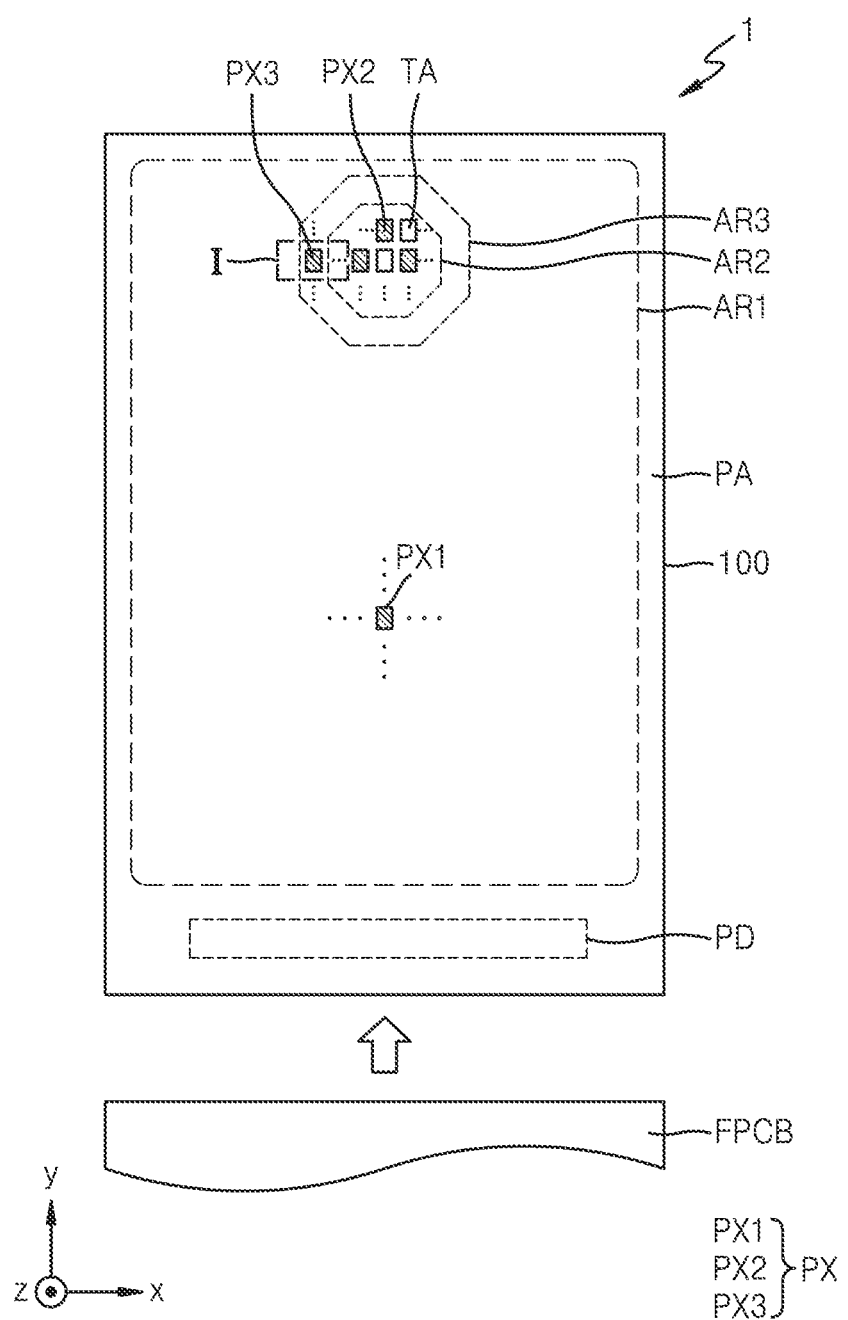
FIG. 1 is a plan view of a display apparatus according to an embodiment.

Reference will now be made in detail to one or more embodiments of the present disclosure, examples of which are illustrated in the accompanying drawings, wherein like reference numerals refer to like elements throughout. In this regard, the one or more embodiments presented herein may have different forms and should not be construed as being limited to the descriptions of the embodiments set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

As the present disclosure allows for various changes and intends to cover numerous embodiments, some embodiments will be illustrated in the drawings and described in detail in the written description. Effects and features of the present disclosure, and methods of achieving them will be clarified with reference to the embodiments described below in detail with reference to the drawings. However, the present disclosure is not limited to the following embodiments and may be embodied in various forms and/or configurations.

The embodiments of the present disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are merely used to distinguish one element from another.

Singular forms such as "a," "an," and "the" as used herein are intended to include plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, one or more intervening layers, regions, or elements may be present therebetween.

Sizes of elements in the drawings may be exaggerated or reduced for convenience of explanation. For example, sizes and thicknesses of elements in the drawings are arbitrarily illustrated for convenience of explanation, and the present disclosure is not limited thereto.

While the present disclosure may describe a specific process order for implementing layer, region, or component according to one embodiment, the specific process order may deviate from the described order in another embodiment. For example, two consecutively described processes may be performed substantially at the same time or performed in an order opposite to the described order.

In the present disclosure, the expression "A and/or B" indicates only A, only B, or both A and B. The expression "at least one of A and B" indicates only A, only B, or both A and B.

It will be further understood that, when layers, regions, or components are referred to as being connected to each other, they may be directly connected to each other or indirectly connected to each other with one or more intervening layers, regions, or components therebetween. For example, when layers, regions, or components are referred to as being electrically connected to each other, they may be directly electrically connected to each other or indirectly electrically connected to each other with one or more intervening layers, regions, or components therebetween.

The x-axis, the y-axis, and the z-axis described herein are not limited to three axes of a rectangular coordinate system and may be interpreted in a broader sense. For example, the x-axis, the y-axis, and the z-axis may be perpendicular to one another or may represent directions that are not perpendicular to one another.

FIG. 1 is a plan view of a display apparatus 1 according to an embodiment.

Referring to FIG. 1, the display apparatus 1 may include a first area AR1, a second area AR2, a third area AR3, and a peripheral area PA around the first area AR1. The display apparatus 1 may provide an image using light emitted in the first area AR1, the second area AR2, and the third area AR3. The display apparatus 1 includes a substrate 100, and it may be stated that the substrate 100 includes the first area AR1, the second area AR2, the third area AR3, and the peripheral area PA.

The first area AR1, the second area AR2, and the third area AR3 may have different shapes and sizes. For example, as illustrated in FIG. 1, the first area AR1 may be greater than the second area AR2, and the first area AR1 may be greater than the third area AR3.

In the present example illustrated in FIG. 1, the planar shape of the first area AR1 may be a rectangular shape. In another example, the planar shape of the first area AR1 may be a polygonal shape such as a triangular shape, a pentagonal shape, or a hexagonal shape, or may be a circular shape or an elliptical shape.

In the present example illustrated in FIG. 1, the planar shape of the second area AR2 may be an octagonal shape. In another example, the planar shape of the second area AR2 may be a polygonal shape such as a triangular shape, a pentagonal shape, or a hexagonal shape, or may be a circular shape or an elliptical shape. In the present example illustrated in FIG. 1, the second area AR2 may be entirely surrounded by the first area AR1 in a plan view. In another example, the second area AR2 may be partially surrounded by the first area AR1. This will be described later with reference to FIGS. 11 and 12.

The third area AR3 may be arranged between the first area AR1 and the second area AR2, and the planar shape of the third area AR3 may vary according to the planar shapes of the first area AR1 and the second area AR2.

The display apparatus 1 may include an array of a plurality of pixels PX on the substrate 100. Each of the pixels PX may include a display element such as an organic light-emitting diode (OLED). The pixels PX may be arranged in various forms, such as a stripe form, a pentile form, or a mosaic form. Hereinafter, each of the pixels PX may refer to a sub-pixel emitting light of a predetermined color, and each of the pixels PX may be, for example, one of a red sub-pixel, a green sub-pixel, and a blue sub-pixel.

The pixels PX may include first pixels PX1 in the first area AR1, second pixels PX2 in the second area AR2, and third pixels PX3 in the third area AR3. The first area AR1, the second area AR2, and the third area AR3, in which the pixels PX are arranged, may provide an image.

According to an embodiment, a density (e.g., a number or an aperture ratio) of the first pixels PX1, a density of the second pixels PX2, and a density of the third pixels PX3 may be different from one another. For example, the density of the first pixels PX1 may be higher than the density of the second pixels PX2 and the density of the third pixels PX3. The density of the third pixels PX3 may be higher than the density of the second pixels PX2.

In a case where the first pixels PX1 and the second pixels PX2 are arranged at different densities from each other, a resolution of the first area AR1 and a resolution of the second area AR2 may be different from each other, and the luminance of light emitted from the first area AR1 and the luminance of light emitted from the second area AR2 may be different from each other. As a result, a user may visually recognize an interface between the first area AR1 and the second area AR2.

In this case, the third area AR3 may be arranged between the first area AR1 and the second area AR2, and the third pixels PX3 in the third area AR3 may be arranged at a density between the density of the first pixels PX1 and the density of the second pixels PX2. The third pixels PX3 in the third area AR3 arranged between the first area AR1 and the second area AR2 and having the density between the density of the first pixels PX1 and the density of the second pixels PX2 may improve a display quality of the display apparatus 1 by preventing or minimizing visual recognition of the interface between the first area AR1 and the second area AR2. As a result, the display apparatus 1 may have an increased display uniformity. The arrangements of the first pixels PX1, the second pixels PX2, and the third pixels PX3 will be described in detail below with reference to FIGS. 3A, 4, and 5A.

The second area AR2 may include a plurality of transmission areas TA. The transmission areas TA may correspond to areas through which light and/or sound that is output from an electronic element under the substrate 100 to the outside or travels from the outside toward the electronic element may be transmitted. The transmission areas TA may be arranged between the neighboring second pixels PX2, respectively.

The peripheral area PA may entirely surround the first area AR1, the second area AR2, and the third area AR3. A scan driver (not shown), a data driver (not shown), and the like may be arranged in the peripheral area PA.

A pad PD may be arranged in the peripheral area PA. The pad PD may be adjacent to one of the edges of the substrate 100. The pad PD may be exposed by not being covered with an insulating layer (not shown) and may be electrically connected to a flexible printed circuit board (FPCB). The FPCB may electrically connect a controller (not shown) to the pad PD and may supply a signal and/or power transmitted from the controller.

According to some embodiments, the data driver may be arranged in the FPCB. The pad PD may be connected to a plurality of lines to transmit signals and/or voltages between the FPCB and the pixels PX.

According to another embodiment, instead of the FPCB, an integrated circuit may be arranged on the pad PD. The integrated circuit may include, for example, the data driver, and may be electrically connected to the pad PD through an anisotropic conductive film including a conductive ball.

Figure 2:
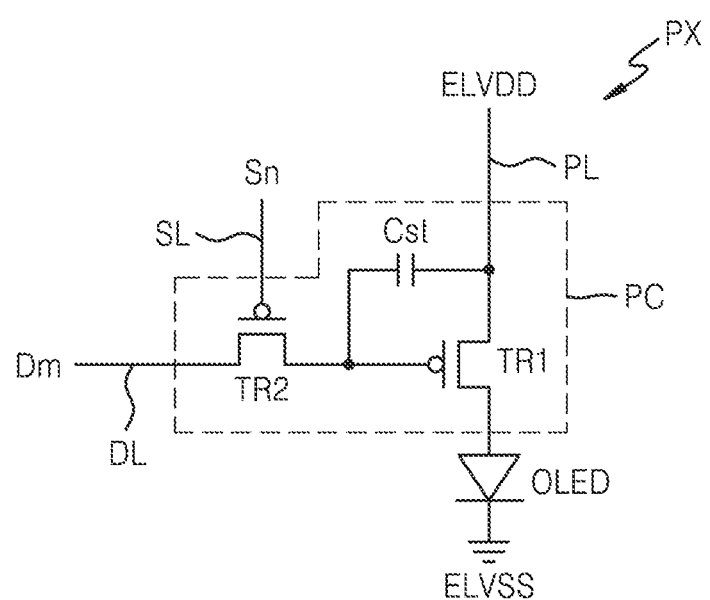
FIG. 2 is a circuit diagram of a pixel of the display apparatus, according to an embodiment.

FIG. 2 is a circuit diagram of a pixel of a display panel, according to an embodiment.

Referring to FIG. 2, the pixel PX may include a pixel circuit PC that is connected to a scan line SL and a data line DL, and an organic light-emitting diode OLED that is connected to the pixel circuit PC.

The pixel circuit PC may include a driving transistor TR1, a scan transistor TR2, and a storage capacitor Cst. The driving transistor TR1 and the scan transistor TR2 may be provided as thin-film transistors.

The scan transistor TR2 may be connected to the scan line SL and the data line DL, and may be configured to transmit, to the driving transistor TR1, a data voltage Dm that is input through the data line DL in synchronization with a scan signal Sn that is input through the scan line SL.

The storage capacitor Cst may be connected to the scan transistor TR2 and a driving voltage line PL and may be configured to store a voltage corresponding to a difference between the data voltage Dm that is received from the scan transistor TR2 and a first driving voltage ELVDD supplied to the driving voltage line PL.

The driving transistor TR1 may be connected to the driving voltage line PL and the storage capacitor Cst and may be configured to control an amount of driving current flowing from the driving voltage line PL to the organic light-emitting diode OLED in response to the voltage value stored in the storage capacitor Cst. A first electrode of the organic light-emitting diode OLED may be connected to the pixel circuit PC, and a second electrode of the organic light-emitting diode OLED may be connected a voltage line that supplies a second driving voltage ELVSS. The organic light-emitting diode OLED may emit light having a certain luminance corresponding to the amount of the driving current.

Although the example of FIG. 2 shows the pixel circuit PC that includes two transistors and one storage capacitor, the present disclosure is not limited thereto. For example, the pixel circuit PC may include three or more transistors and/or two or more storage capacitors. According to an embodiment, the pixel circuit PC may include seven transistors and one storage capacitor.

Figure 3A:
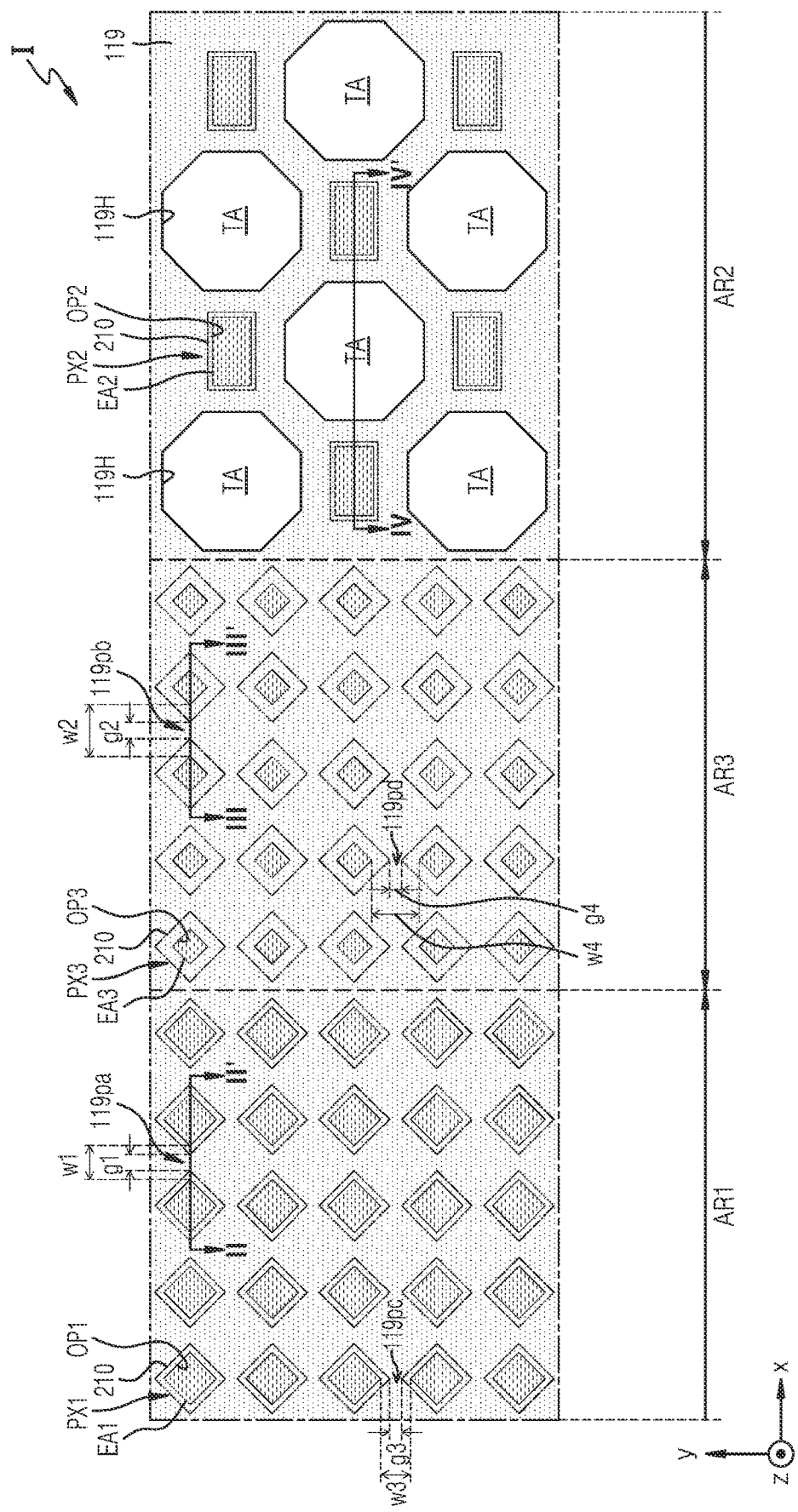
FIG. 3A is an enlarged plan view of a portion of a display apparatus, according to an embodiment.
Figure 3B:
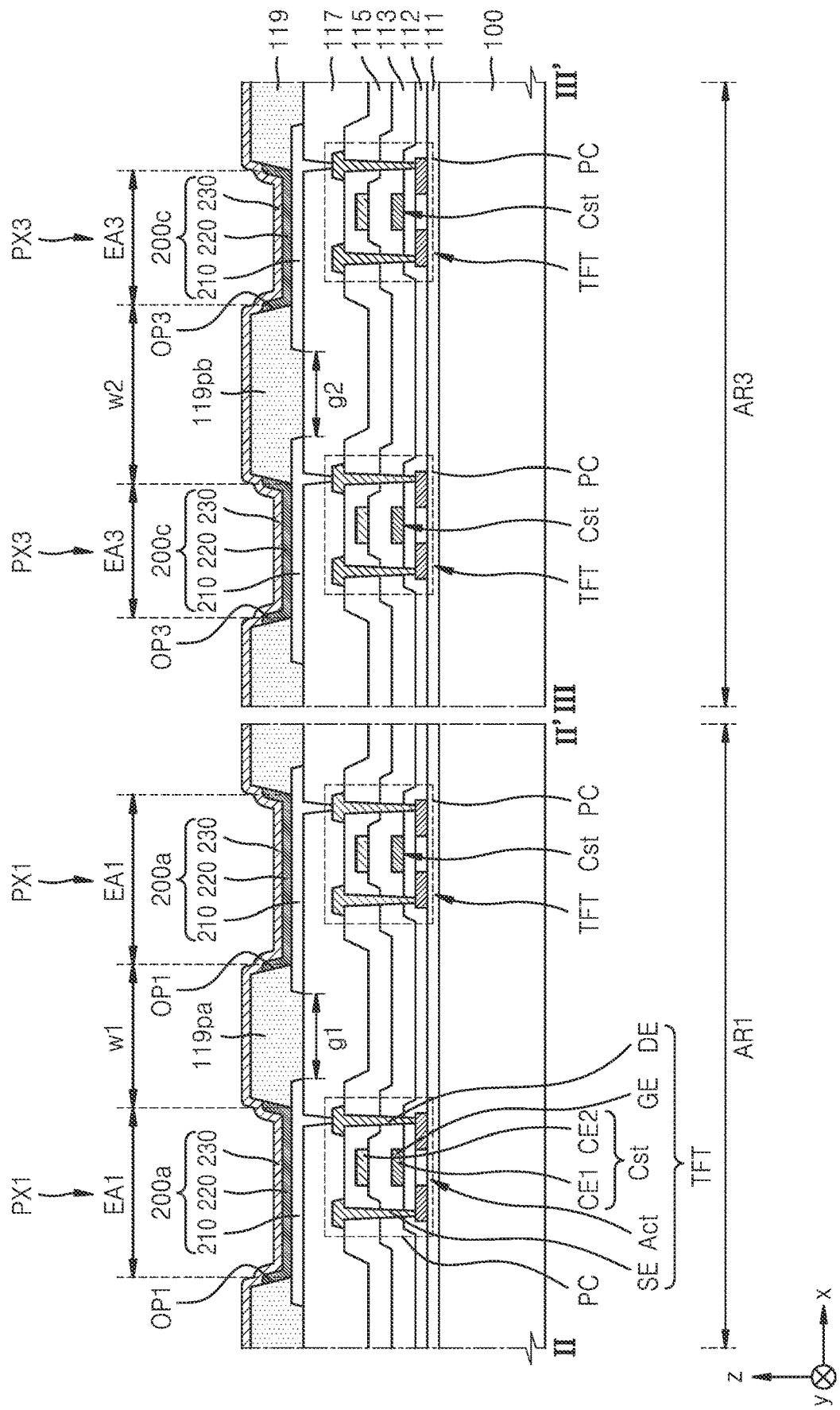
FIG. 3B is a cross-sectional view of a first area and a third area taken along lines II-II' and III-III' of FIG. 3A, respectively.
Figure 3C:
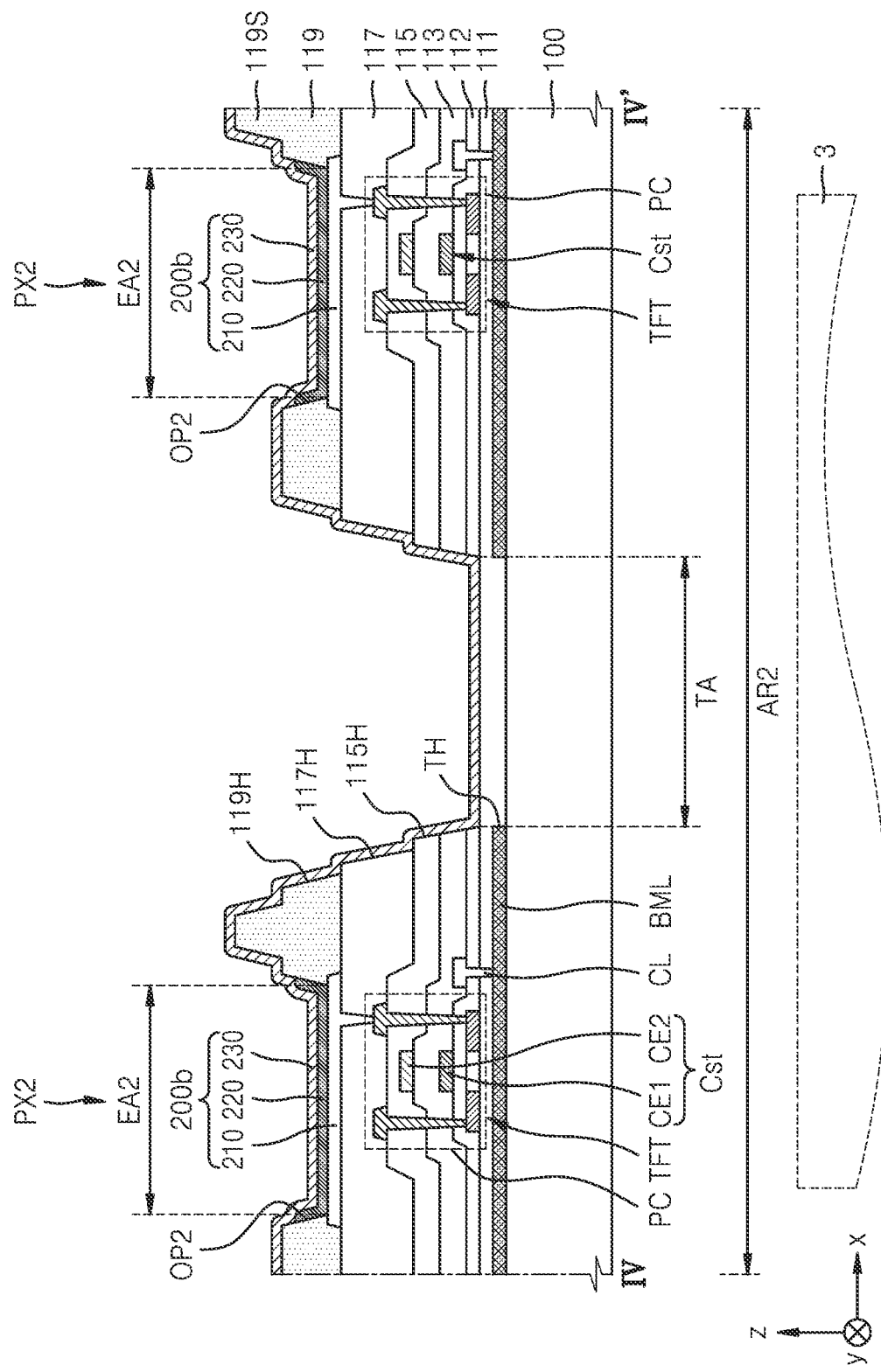
FIG. 3C is a cross-sectional view of a second area taken along line IV-IV' of FIG. 3A.

FIG. 3A is an enlarged plan view of a portion of the display apparatus 1, according to an embodiment, FIG. 3B is a cross-sectional view of the first area AR1 and the third area AR3 taken along lines II-II' and III-III' of FIG. 3A, respectively, and FIG. 3C is a cross-sectional view of the second area AR2 taken along line IV-IV' of FIG. 3A. Specifically, FIG. 3A is an enlarged view of region I of FIG. 1.

Referring to FIG. 3A, the display apparatus 1 may include the first area AR1, the second area AR2, and the third area AR3 between the first area AR1 and the second area AR2. The first pixels PX1 may be arranged in the first area AR1, the second pixels PX2 may be arranged in the second area AR2, and the third pixels PX3 may be arranged in the third area AR3. The transmission areas TA may be arranged in the second area AR2 between the neighboring second pixels PX2.

FIG. 3A illustrates that the first pixels PX1 and the third pixels PX3 are arranged in a first direction (e.g., ±x direction) and a second direction (e.g., ±y direction), respectively, but the arrangements of the first pixels PX1 and the third pixels PX3 may be freely changed according to a design. For example, the first pixels PX1 and the third pixels PX3 may be arranged in different directions or randomly. FIG. 3A illustrates the first pixels PX1 and the third pixels PX3 as an example, but the same may also apply to the arrangement of the second pixels PX2.

Referring to FIGS. 3B and 3C, the first pixel PX1 may include a pixel circuit PC and a first display element 200a that is electrically connected to the pixel circuit PC, the second pixel PX2 may include another pixel circuit PC and a second display element 200b that is electrically connected to the pixel circuit PC, and the third pixel PX3 may include yet another pixel circuit PC and a third display element 200c that is electrically connected to the pixel circuit PC.

Each of the first display element 200a, the second display element 200b, and the third display element 200c may include a pixel electrode 210, an intermediate layer 220, and an opposite electrode 230. The pixel electrode 210 may be connected to a thin-film transistor TFT of the pixel circuit PC. The pixel electrode 210 may include a (semi)transmissive electrode or a reflective electrode. The intermediate layer 220 may include an organic emission layer. The organic emission layer included in the intermediate layer 220 may emit red light, green light, blue light, or white light.

A pixel defining layer 119 may be arranged on the pixel electrode 210 and may serve as an insulating layer. According to an embodiment, the pixel defining layer 119 may be black. The pixel defining layer 119 may include at least one of a black pigment, a black dye, or black particles. The pixel defining layer 119 may include chromium (Cr), chromium oxide ($Cr_xO_y$), $Cr/Cr_xO_y$, $Cr/Cr_xO_y$/chromium nitride ($CrN_y$), a resin (e.g., a carbon pigment, a red/green/blue (RGB)-mixed pigment, etc.), graphite, a non-Cr-based pigment, a lactam-based pigment, or a perylene-based pigment. The pixel defining layer 119 may include a black organic pigment, and the black organic pigment may include at least one selected from aniline black, lactam black, and perylene black.

The pixel defining layer 119 may include a first opening OP1 that exposes at least a portion of the pixel electrode 210 of the first display element 200a, a second opening OP2 that exposes at least a portion of the pixel electrode 210 of the second display element 200b, and a third opening OP3 that exposes at least a portion of the pixel electrode 210 of the third display element 200c. The first opening OP1 may define a first emission area EA1 of the first pixel PX1, the second opening OP2 may define a second emission area EA2 of the second pixel PX2, and the third opening OP3 may define a third emission area EA3 of the third pixel PX3. The first to third emission areas EA1, EA2, and EA3 may correspond to areas in which red light, green light, blue light, or white light is emitted.

The pixel defining layer 119 may include a plurality of first holes 119H that exposes at least a portion of the substrate 100 in the second area AR2. Each of the first holes 119H may define the transmission area TA.

Referring back to FIG. 3A, the number of first pixels PX1 per unit area in the first area AR1 may be greater than the number of second pixels PX2 per unit area in the second area AR2. In other words, the number of first openings OP1 per unit area in the first area AR1 may be greater than the number of second openings OP2 per unit area in the second area AR2. As a result, the resolution of the first area AR1 may be higher than the resolution of the second area AR2.

According to an embodiment, in a plan view, the area of the first openings OP1 in the first area AR1 may be greater than the area of the third openings OP3 in the third area AR3, and aperture ratio of the first pixels PX1 may be higher than the aperture ratio of the third pixels PX3. In other words, the first emission area EA1 of the first pixels PX1 may be greater than the third emission area EA3 of the third pixels PX3

Due to the difference between the aperture ratio of the first pixels PX1 and the aperture ratio of the third pixels PX3, the luminance of the first area AR1 may be different from the luminance of the third area AR3. Because the aperture ratio of the first pixels PX1 is higher than the aperture ratio of the third pixels PX3, the luminance of the first area AR1 may be higher than the luminance of the third area AR3. In this case, for the same signal corresponding to a first gray scale value being input, the amount of first color light emitted from the first pixels PX1 may be greater than the amount of first color light emitted from the third pixels PX3. As such, the third area AR3 having a luminance lower than that of the first area AR1 and greater than that of the second area AR2 may reduce the difference in resolution between the first area AR1 and the second area AR2. Therefore, an interface between the first area AR1 and the second area AR2 may be visually less recognizable to a user, and the display uniformity and the display quality of the display apparatus 1 may be improved.

According to an embodiment, a first width w1 between the first openings OP1 adjacent to each other in the first direction (e.g., ±x direction) may be less than a second width w2 between the third openings OP3 adjacent to each other in the first direction. In other words, the first width w1 of a first portion 119pa of the pixel defining layer 119 between the first openings OP1 adjacent to each other in the first direction may be less than the second width w2 of a second portion 119pb of the pixel defining layer 119 between the third openings OP3 adjacent to each other in the first direction.

On the other hand, a first gap g1 between the pixel electrodes 210 of the first pixels PX1 adjacent to each other in the first direction may be substantially equal to a second gap g2 between the pixel electrodes 210 of the third pixels PX3 adjacent to each other in the first direction.

According to an embodiment, a third width w3 between the first openings OP1 adjacent to each other in the second direction (e.g., ±y direction) may be less than a fourth width w4 between the third openings OP3 adjacent to each other in the second direction. In other words, the third width w3 of a third portion 119pc of the pixel defining layer 119 between the first openings OP1 adjacent to each other in the second direction may be less than the fourth width w4 of a fourth portion 119pd of the pixel defining layer 119 between the third openings OP3 adjacent to each other in the second direction.

On the other hand, a third gap g3 between the pixel electrodes 210 of the first pixels PX1 adjacent to each other in the second direction may be substantially equal to a fourth gap g4 between the pixel electrodes 210 of the third pixels PX3 adjacent to each other in the second direction.

The sizes and arrangements of the pixel electrodes 210 respectively arranged in the first area AR1 and the third area AR3 may be substantially the same as each other, but the areas in which the pixel electrodes 210 are exposed by the pixel defining layer 119 may be different from each other for each region. The area of a portion of the pixel electrode 210 that is exposed by the pixel defining layer 119 in the first area AR1 may be greater than the area of a portion of the pixel electrode 210 that is exposed by the pixel defining layer 119 in the third area AR3. In other words, the area in which the pixel electrode 210 and the pixel defining layer 119 overlap each other in the first area AR1 may be less than the area in which the pixel electrode 210 and the pixel defining layer 119 overlap each other in the third area AR3.

According to an embodiment, the second emission area EA2 may be greater than the first emission area EA1 and the third emission area EA3. This is only an example and may be changed according to a design.

Hereinafter, the display apparatus 1 according to the embodiment will be described in detail with reference to FIGS. 3B and 3C.

The substrate 100 may include glass or a polymer resin. Examples of the polymer resin include, but are not limited to, polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be flexible, rollable, or bendable. The substrate 100 may have a multilayer structure including an inorganic layer (not illustrated) and a layer including the above-described polymer resin.

A buffer layer 111 may reduce or prevent infiltration of foreign material, moisture, or ambient air from below the substrate 100 and may provide a flat surface on the substrate 100. The buffer layer 111 may include an inorganic material such as oxide or nitride, an organic material, or an organic-inorganic composite material, and may have a single-layer or multilayer structure including an inorganic material and an organic material.

A barrier layer (not illustrated) may be further arranged between the substrate 100 and the buffer layer 111. The barrier layer may prevent or minimize infiltration of impurities from the substrate 100 into a pixel circuit PC that is arranged on the buffer layer 111. The barrier layer may include an inorganic material such as oxide or nitride, an organic material, or an organic-inorganic composite material, and may have a single-layer or multilayer structure including an inorganic material and an organic material.

The pixel circuit PC arranged on the buffer layer 111 may include a thin-film transistor TFT and a storage capacitor Cst. The thin-film transistor TFT may include a semiconductor layer Act, a gate electrode GE, and the like.

The semiconductor layer Act may include amorphous silicon or polysilicon. According to an embodiment, the semiconductor layer Act may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer Act may include a channel region, and a source region and a drain region on both sides of the channel region. The semiconductor layer Act may include a single layer or multiple layers.

A first gate insulating layer 112 and a second gate insulating layer 113 may be stacked on the substrate 100 to cover the semiconductor layer Act. The first gate insulating layer 112 and the second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The gate electrode GE may be arranged on the first gate insulating layer 112 to at least partially overlap the semiconductor layer Act. FIGS. 3B and 3C illustrate that the gate electrode GE is arranged on the first gate insulating layer 112, but in another embodiment, the gate electrode GE may be arranged on the second gate insulating layer 113.

The storage capacitor Cst may include a lower electrode CE1 and an upper electrode CE2. As illustrated in FIGS. 3B and 3C, the storage capacitor Cst may overlap the thin-film transistor TFT. For example, the gate electrode GE of the thin-film transistor TFT may serve as the lower electrode CE1 of the storage capacitor Cst. In another embodiment, the storage capacitor Cst may not overlap the thin-film transistor TFT, and the storage capacitor Cst and the thin-film transistor TFT may be separately arranged.

The upper electrode CE2 of the storage capacitor Cst may overlap the lower electrode CE1 with the second gate insulating layer 113 arranged therebetween to form the storage capacitor Cst. In this case, the second gate insulating layer 113 may serve as a dielectric layer of the storage capacitor Cst.

An interlayer insulating layer 115 may be arranged on the second gate insulating layer 113 to cover the upper electrode CE2 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A source electrode SE, the drain electrode DE, and the like may be arranged on the interlayer insulating layer 115. Although FIGS. 3B and 3C illustrate that both the source electrode SE and the drain electrode DE are arranged on the interlayer insulating layer 115, at least one of the source electrode SE and the drain electrode DE may be omitted in other embodiments.

The source electrode SE and the drain electrode DE may include a conductive material including, but not limited to, molybdenum (Mo), aluminum (Al), copper (Cu), titanium (Ti), and the like, and may include a single layer or multiple layers including the above-described conductive material. For example, the source electrode SE and the drain electrode DE may have a multilayer structure of Ti/Al/Ti. The source electrode SE and the drain electrode DE may be respectively connected to the source region and the drain region of the semiconductor layer Act through contact holes.

The source electrode SE and the drain electrode DE may be covered with an inorganic protective layer (not illustrated). The inorganic protective layer may include a single layer or multiple layers including, but not limited to, silicon nitride ($SiN_x$) and silicon oxide ($SiO_x$). The inorganic protective layer may cover and protect signal lines or wires on the interlayer insulating layer 115.

A planarization layer 117 may be arranged to cover the source electrode SE and the drain electrode DE, and the planarization layer 117 may include contact holes for connecting the thin-film transistors TFT to the pixel electrodes 210.

The planarization layer 117 may include a single layer or multiple layers including an organic material and may provide a flat upper surface. The planarization layer 117 may include a polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, or any blend thereof.

The first display element 200a, the second display element 200b, and the third display element 200c may be arranged on the planarization layer 117. The first display element 200a may be arranged in the first area AR1, the second display element 200b may be arranged in the second area AR2, and the third display element 200c may be arranged in the third area AR3. Each of the first display element 200a, the second display element 200b, and the third display element 200c may include a pixel electrode 210, an intermediate layer 220, and an opposite electrode 230.

The pixel electrode 210 may include a (semi)transmissive electrode or a reflective electrode. According to some embodiments, the pixel electrode 210 may include a reflective layer including Ag, Mg, Al, Pt, Pd, Au, Ni, Nd, Ir, Cr, or any compound thereof, and a transparent or translucent electrode layer arranged on the reflective layer. The transparent or translucent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the pixel electrode 210 may include ITO/Ag/ITO.

According to an embodiment, as illustrated in FIG. 3B, the first gap g1 between the pixel electrodes 210 of the first display elements 200a adjacent to each other in the first direction may be substantially equal to the second gap g2 between the pixel electrodes 210 of the third display elements 200c adjacent to each other in the first direction.

The pixel defining layer 119 may be arranged on the planarization layer 117. The pixel defining layer 119 may prevent occurrence of an electric arc or the like on edges of the pixel electrodes 210 by increasing distances between the edges of the pixel electrodes 210 and portions of the opposite electrode 230 on the pixel electrodes 210. The pixel defining layer 119 may include first to third openings OP1, OP2, and OP3 that exposes at least portions of the pixel electrodes 210, respectively.

Because the first to third openings OP1, OP2, and OP3 may respectively define the first to third emission areas EA1, EA2, and EA3, the first to third openings OP1, OP2, and OP3 may respectively correspond to the first to third emission areas EA1, EA2, and EA3 in a plan view.

The pixel defining layer 119 may be formed through spin coating or the like using an organic insulating material selected from polyimide, polyamide, acrylic resin, benzocyclobutene, and phenol resin.

According to an embodiment, the pixel defining layer 119 may include at least one of a black pigment, a black dye, or black particles. For example, the pixel defining layer 119 may include, but is not limited to, Cr, $Cr_xO_y$, $Cr/Cr_xO_y$, $Cr/Cr_xO_y/CrN_y$, a resin (a carbon pigment, an RGB mixed pigment, etc.), graphite, a non-Cr-based pigment, a lactam-based pigment, or a perylene-based pigment. The pixel defining layer 119 may include a black organic pigment, and the black organic pigment may include at least one selected from aniline black, lactam black, and perylene black.

According to an embodiment, as illustrated in FIG. 3B, the size of the first openings OP1 in the first area AR1 may be greater than the size of the third openings OP3 in the third area AR3, and the aperture ratio of the first pixels PX1 may be higher than the aperture ratio of the third pixels PX3. In other words, the first emission area EA1 of the first pixels PX1 may be greater than the third emission area EA3 of the third pixels PX3.

Also, the first width w1 of the first portion 119pa of the pixel defining layer 119 between the first openings OP1 adjacent to each other in the first direction (e.g., ±x direction) may be less than the second width w2 of the second portion 119pb of the pixel defining layer 119 between the third openings OP3 adjacent to each other in the first direction.

As illustrated in FIG. 3C, a spacer 119S may be arranged on the pixel defining layer 119. The spacer 119S may prevent a damage to the substrate 100 during the manufacturing of the display apparatus 1. For example, a mask sheet that may enter an opening (e.g., the first to third openings OP1, OP2, and OP3) of the pixel defining layer 119 or may be in close contact with the pixel defining layer 119 during the manufacturing of the display apparatus 1 may damage or break a portion of the substrate 100. The spacer 119S may prevent such a damage that may be caused by the mask sheet. The spacer 119S may include an organic insulating material such as polyimide. Alternatively, the spacer 119S may include an inorganic insulating material such as silicon nitride or silicon oxide, or may include an organic insulating material and an inorganic insulating material.

According to an embodiment, the spacer 119S may include the same material as that of the pixel defining layer 119. In this case, as illustrated in FIG. 3C, the spacer 119S may be integrally formed with the pixel defining layer 119. For example, the spacer 119S may be formed together with the pixel defining layer 119 through a mask process using a halftone mask or a slit mask.

According to another embodiment, the spacer 119S may include a material different from that of the pixel defining layer 119.

The intermediate layer 220 may be arranged in the first to third openings OP1, OP2, and OP3 that are formed by the pixel defining layer 119, and may include an organic emission layer. The organic emission layer may include an organic material including a fluorescent material or a phosphorescent material emitting red light, green light, blue light, or white light. The organic emission layer may include a low-molecular weight organic material or a high-molecular weight organic material. A hole transport layer (HTL), a hole injection layer (HIL), an electron transport layer (ETL), an electron injection layer (EIL), and the like may be further arranged below and above the organic emission layer.

The opposite electrode 230 may include a transmissive electrode or a reflective electrode. According to an embodiment, the opposite electrode 230 may include a transparent or translucent electrode, and may include a metal thin-film having a low work function, including Li, Ca, LiF/Ca, LiF/Al, Al, Ag, Mg, or any compound thereof. Also, a transparent conductive oxide (TCO) layer such as ITO, IZO, ZnO, or $In_2O_3$ may be further arranged on the metal thin-film. The opposite electrode 230 may be arranged over the display area DA on the intermediate layer 220 and the pixel defining layer 119. The opposite electrode 230 of the first to third display elements 200a, 200b, and 200c may be formed integrally to correspond to the pixel electrodes 210.

In a case where the first to third display elements 200a, 200b, and 200c are organic light-emitting diodes, the organic light-emitting diodes may be easily damaged by external moisture or oxygen. An encapsulation layer (not illustrated) may be arranged to cover and protect the organic light-emitting diodes. The encapsulation layer may cover the first to third areas AR1, AR2, and AR3 and extend to at least a portion of the peripheral area PA. The encapsulation layer may include a first inorganic encapsulation layer, an organic encapsulation layer, and a second inorganic encapsulation layer.

Referring to FIG. 3C, a metal layer BML may be arranged on the substrate 100. The metal layer BML may be arranged between the substrate 100 and the buffer layer 111. The metal layer BML may be in the second area AR2 and prevent the pixel circuit PC from being damaged by light passing through the transmission area TA of the second area AR2.

The metal layer BML may include a through hole TH that corresponds to the transmission area TA. The metal layer BML may include a conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu).

The metal layer BML may be electrically connected to a connection line CL. The connection line CL may be electrically connected to the gate electrode GE, the source electrode SE, or the drain electrode DE of the thin-film transistor TFT, or may be electrically connected to the storage capacitor Cst. Alternatively, the connection line CL may be electrically connected to the driving voltage line PL shown in FIG. 2. The metal layer BML connected to the connection line CL may protect the thin-film transistor TFT from external static electricity, or may improve the performance of the thin-film transistor TFT.

The transmission area TA may correspond to an area through which light or sound emitted from a component 3 or received by the component 3 may be transmitted. The transmission area TA may be in the second area AR2. The pixel circuit PC and a display element may not be arranged in the transmission area TA.

The first gate insulating layer 112, the second gate insulating layer 113, the interlayer insulating layer 115, the planarization layer 117, and the pixel defining layer 119 may respectively include holes corresponding to the transmission areas TA. For example, as illustrated in FIG. 3C, the pixel defining layer 119 may include a first hole 119H, the planarization layer 117 may include a second hole 117H, and the interlayer insulating layer 115 may include a third hole 115H. The transmission area TA may be defined by the first to third holes 119H, 117H, and 115H.

As illustrated in FIG. 3C, an electronic apparatus including the display apparatus 1 may include the component 3 on the rear surface of the display apparatus 1. The component 3 may include an electronic element such as a sensor (e.g., a proximity sensor) configured to detect a presence of an object or measure a distance to an object, a sensor configured to recognize part of a user's body (e.g., a fingerprint, an iris, a face, etc.), a lamp configured to output light, or an image sensor (e.g., a camera) configured to capture an image. An electronic element using light may use light of various wavelength bands such as visible light, infrared light, and ultraviolet light. An electronic element using sound may use ultrasonic waves or sound of other frequency bands.

FIG. 4 is an enlarged plan view of a portion (i.e., region I) of the display apparatus 1, according to another embodiment. In FIG. 4, the same reference numerals as those in FIGS. 3A to 3C denote the same members, and redundant descriptions thereof may be omitted. Also, FIG. 4 illustrates a modification to the embodiment of FIG. 3A, and there is a difference in a structure of the third pixel PX3 in the third area AR3. Hereinafter, description previously given with respect to FIG. 3A is omitted, and the differences will be mainly described.

Referring to FIG. 4, the third area AR3 may include a first portion AR3a, a second portion AR3b, and a third portion AR3c. The first portion AR3a of the third area AR3 may be adjacent to the first area AR1, and the third portion AR3c of the third area AR3 may be adjacent to the second area AR2. The second portion AR3b of the third area AR3 may be arranged between the first portion AR3a of the third area AR3 and the third portion AR3c of the third area AR3. Although FIG. 4 illustrates that the third area AR3 is divided into three portions including the first portion AR3a, the second portion AR3b, and the third portion AR3c, the third area AR3 may be divided into two portions or more portions in other embodiments without deviating from the scope of the present disclosure.

As described above with reference to FIG. 3A, the third pixels PX3 may be arranged in the third area AR3. The third pixels PX3 in the first portion AR3a of the third area AR3 may be referred to as $(3\text{-}1)^{th}$ pixels PX3-1, the third pixels PX3 in the second portion AR3b of the third area AR3 may be referred to as $(3\text{-}2)^{th}$ pixels PX3-2, and the third pixels PX3 in the third portion AR3c of the third area AR3 may be referred to as $(3\text{-}3)^{th}$ pixels PX3-3.

The third openings OP3 in the first portion AR3a of the third area AR3 may be referred to as $(3\text{-}1)^{th}$ openings OP3-1, the third openings OP3 in the second portion AR3b of the third area AR3 may be referred to as $(3\text{-}2)^{th}$ openings OP3-2, and the third openings OP3 in the third portion AR3c of the third area AR3 may be referred to as $(3\text{-}3)^{th}$ openings OP3-3.

The $(3\text{-}1)^{th}$ openings OP3-1 may expose at least portions of the pixel electrodes 210 arranged in the first portion AR3a of the third area AR3, respectively, the $(3\text{-}2)^{th}$ openings OP3-2 may expose at least portions of the pixel electrodes 210 arranged in the second portion AR3b of the third area AR3, respectively, and the $(3\text{-}3)^{th}$ openings OP3-3 may expose at least portions of the pixel electrodes 210 arranged in the third portion AR3c of the third area AR3, respectively.

The third emission areas EA3 in the first portion AR3a of the third area AR3 may be referred to as $(3\text{-}1)^{th}$ emission areas EA3-1, the third emission areas EA3 in the second portion AR3b of the third area AR3 may be referred to as $(3\text{-}2)^{th}$ emission areas EA3-2, and the third emission areas EA3 in the third portion AR3c of the third area AR3 may be referred to as $(3\text{-}3)^{th}$ emission areas EA3-3.

The $(3\text{-}1)^{th}$ opening OP3-1 may define the $(3\text{-}1)^{th}$ emission area EA3-1, the $(3\text{-}2)^{th}$ opening OP3-2 may define the $(3\text{-}2)^{th}$ emission area EA3-2, and the $(3\text{-}3)^{th}$ opening OP3-3 may define the $(3\text{-}3)^{th}$ emission EA3-3.

According to an embodiment, the area of the $(3\text{-}1)^{th}$ openings OP3-1 may be greater than the area of the $(3\text{-}2)^{th}$ openings OP3-2. The area of the $(3\text{-}2)^{th}$ openings OP3-2 may be greater than the area of the $(3\text{-}3)^{th}$ openings OP3-3. In other words, the $(3\text{-}1)^{th}$ emission area EA3-1 of the $(3\text{-}1)^{th}$ pixel PX3-1 may be greater than the $(3\text{-}2)^{th}$ emission area EA3-2 of the $(3\text{-}2)^{th}$ pixel PX3-2. The $(3\text{-}2)^{th}$ emission area EA3-2 of the $(3\text{-}2)^{th}$ pixel PX3-2 may be greater than the $(3\text{-}3)^{th}$ emission area EA3-3 of the $(3\text{-}3)^{th}$ pixel PX3-3.

In a plan view, the area of the third openings OP3 may gradually decrease in a direction from the first area AR1 to the second area AR2. The area of the third openings OP3 may gradually decrease as the distance to the second area AR2 decreases. For example, the area of the third openings OP3 may gradually decrease in the +x direction.

In other words, the third emission area EA3 of the third pixel PX3 may gradually decrease in the +x direction from the first area AR1 to the second area AR2. The third emission area EA3 of the third pixel PX3 may gradually decrease as the distance to the second area AR2 decreases.

In other words, the aperture ratio of the third pixels PX3 may gradually decrease in the +x direction from the first area AR1 to the second area AR2. The aperture ratio of the third openings OP3 may gradually decrease as the distance to the second area AR2 decreases.

As described above, the aperture ratio of the third pixels PX3 that gradually decreases as the distance to the second area AR2 decreases may gradually decrease the luminance of the third area AR3 as the distance to the second area AR2 decreases.

As described above with reference to FIG. 3A, the first area AR1 and the second area AR2 may have different resolutions from each other due to their different pixel arrangements. The third area AR3 arranged between the first area AR1 and the second area AR2 may reduce a difference in resolution and a difference in luminance between the first area AR1 and the second area AR2. As the luminance gradually decreases between the first area AR1 and the second area AR2, an interface between the first area AR1 and the second area AR2 may be visually less recognizable to a user.

Figure 5B:
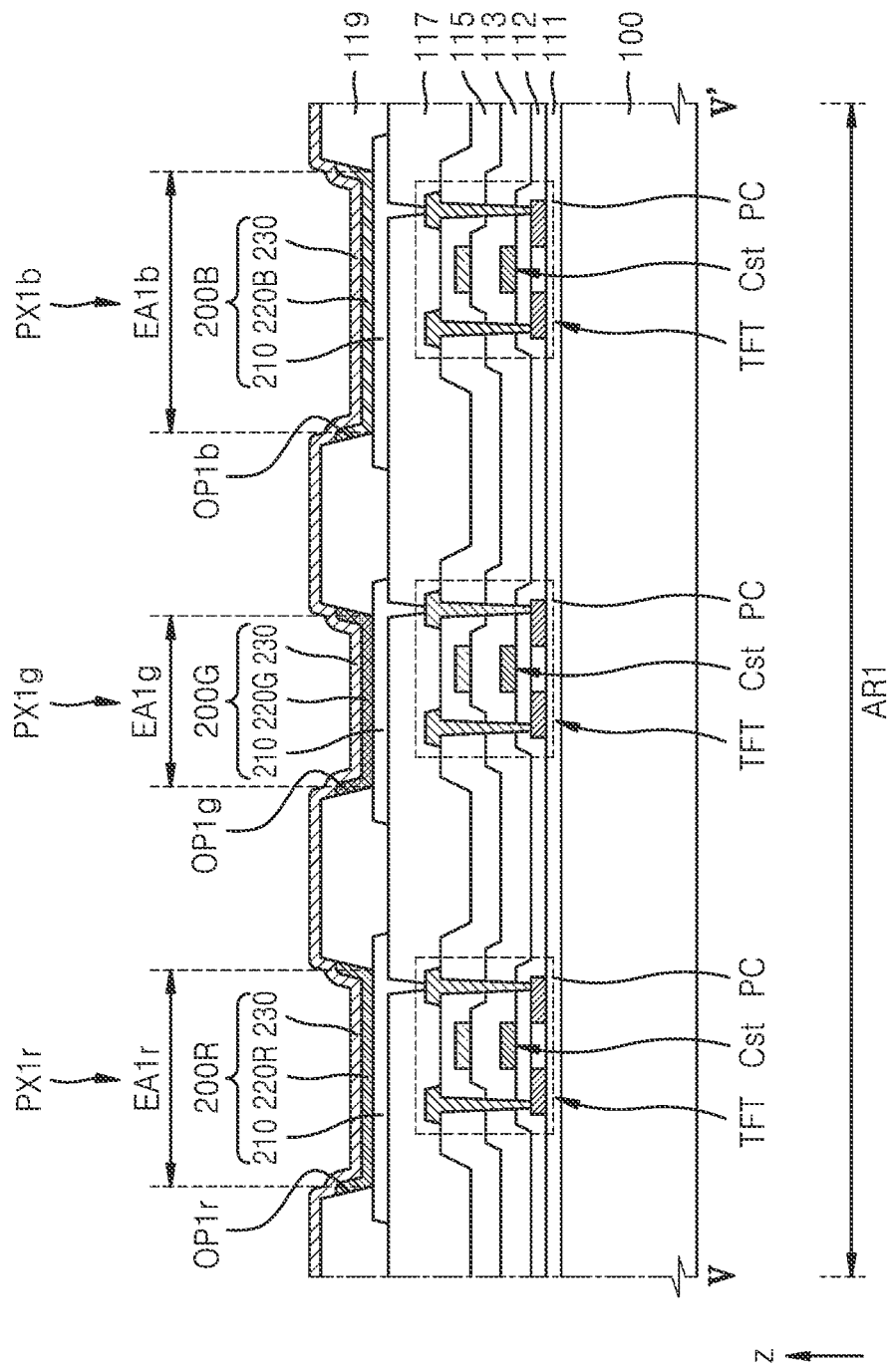
FIG. 5B is a cross-sectional view of a first area taken along line V-V' of FIG. 5A.

FIG. 5A is an enlarged plan view of a portion (i.e., region I) of the display apparatus 1, according to another embodiment, and FIG. 5B is a cross-sectional view of a first area taken along line V-V' of FIG. 5A.

Referring to FIG. 5A, the display apparatus 1 (may include the first area AR1, the second area AR2, and the third area AR3 between the first area AR1 and the second area AR2.

First red pixels PX1r, first green pixels PX1g, and first blue pixels PX1b may be arranged in the first area AR1. Second red pixels PX2r, second green pixels PX2g, and second blue pixels PX2b may be arranged in the second area AR2. Third red pixels PX3r, third green pixels PX3g, and third blue pixels PX3b may be arranged in the third area AR3.

In the first area AR1, the first red pixels PX1r and the first blue pixels PX1b may be alternately arranged in a first direction (e.g., ±x direction) and a second direction (e.g., ±y direction). The first red pixels PX1r and the first green pixels PX1g may be alternately arranged in the second direction, and the first blue pixels PX1b and the first green pixels PX1g may be alternately arranged in the second direction.

In the third area AR3, the third red pixels PX3r and the third blue pixels PX3b may be alternately arranged in the first direction and the second direction. The third red pixels PX3r and the third green pixels PX3g may be alternately arranged in the second direction, and the third blue pixels PX3b and the third green pixels PX3g may be alternately arranged in the second direction.

FIG. 5A illustrates that the first red pixels PX1r, the first green pixels PX1g, and the first blue pixels PX1b are arranged in a pentile pattern in the first area AR1, but the present disclosure is not limited thereto. The first red pixels PX1r, the first green pixels PX1g, and the first blue pixels PX1b may be arranged in various patterns such as a stripe pattern or an s-stripe pattern. The above description has been made with respect to the first area AR1, but the same may also apply to the third area AR3.

FIG. 5A illustrates that the second red pixels PX2r, the second green pixels PX2g, and the second blue pixels PX2b are arranged in an s-stripe pattern in the second area AR2, but the present disclosure is not limited thereto. The second red pixels PX2r, the second green pixels PX2g, and the second blue pixels PX2b may be arranged in various patterns such as a stripe pattern or a pentile pattern.

Referring to FIG. 5B, the first red pixel PX1r in the first area AR1 may include a pixel circuit PC and a first display element 200R that is electrically connected to the pixel circuit PC, the first green pixel PX1g may include another pixel circuit PC and a second display element 200G that is electrically connected to the pixel circuit PC, and the first blue pixel PX1b may include yet another pixel circuit PC and a third display element 200B that is electrically connected to the pixel circuit PC.

The first display element 200R may include a pixel electrode 210, a first intermediate layer 220R, and an opposite electrode 230, the second display element 200G may include a pixel electrode 210, a second intermediate layer 220G, and an opposite electrode 230, and the third display element 200B may include a pixel electrode 210, a third intermediate layer 220B, and an opposite electrode 230.

The first intermediate layer 220R may include a first organic emission layer and may emit light of a first color. The second intermediate layer 220G may include a second organic emission layer and may emit light of a second color. The third intermediate layer 220B may include a third organic emission layer and may emit light of a third color. For example, the first color may be red, the second color may be green, and the third color may be blue.

Each of the first to third organic emission layers may include a low-molecular weight organic material or a high-molecular weight organic material. An HTL, an HIL, an ETL, an EIL, and the like may be further arranged below and above each of the first to third organic emission layers.

The pixel defining layer 119 may be arranged on the pixel electrode 210 and may serve as an insulating layer. According to an embodiment, the pixel defining layer 119 may be black. For example, the pixel defining layer 119 may include at least one of a black pigment, a black dye, or black particles. The pixel defining layer 119 may include, but is not limited to, Cr, $Cr_xO_y$, $Cr/Cr_xO_y$, $Cr/Cr_xO_y/CrN_y$, a resin (e.g., a carbon pigment, an RGB mixed pigment, etc.), graphite, a non-Cr-based pigment, a lactam-based pigment, or a perylene-based pigment. The pixel defining layer 119 may include a black organic pigment, and the black organic pigment may include at least one selected from aniline black, lactam black, and perylene black.

The pixel defining layer 119 may include a $(1-1)^{th}$ opening OP1r that exposes at least a portion of the pixel electrode 210 of the first display element 200R of the first red pixel PX1r, a $(1-2)^{th}$ opening OP1g that exposes at least a portion of the pixel electrode 210 of the second display element 200G of the first green pixel PX1g, and a $(1-3)^{th}$ opening OP1b that exposes at least a portion of the pixel electrode 210 of the third display element 200B of the first blue pixel PX1b. In this case, the $(1-1)^{th}$ opening OP1r may define a $(1-1)^{th}$ emission area EA1r of the first red pixel PX1r, the $(1-2)^{th}$ opening OP1g may define a $(1-2)^{th}$ emission area EA1g of the first green pixel PX1g, and the $(1-3)^{th}$ opening OP1b may define a $(1-3)^{th}$ emission area EA1b of the first blue pixel PX1b. The $(1-1)^{th}$ to $(1-3)^{th}$ emission areas EA1r, EA1g, and EA1b may correspond to areas in which red light, green light, and blue light is emitted, respectively.

The above description has been made with respect to the first red pixels PX1r, the first green pixels PX1g, and the first blue pixels PX1b that are arranged in the first area AR1, but the same may also apply to the second area AR2 and the third area AR3.

That is, the second red pixel PX2r in the second area AR2 may include a pixel circuit PC and a first display element 200R, the second green pixel PX2g may include another pixel circuit PC and a second display element 200G, and the second blue pixel PX2b may include yet another pixel circuit PC and a third display element 200B. The third red pixel PX3r in the third area AR3 may include a pixel circuit PC and a first display element 200R, the third green pixel PX3g may include another pixel circuit PC and a second display element 200G, and the third blue pixel PX3b may include yet another pixel circuit PC and a third display element 200B.

Referring back to FIG. 5A, the pixel defining layer 119 may include a $(2-1)^{th}$ opening OP2r that exposes at least a portion of the pixel electrode 210 of the second red pixel PX2r, a $(2-2)^{th}$ opening OP2g that exposes at least a portion of the pixel electrode 210 of the second green pixel PX2g, and a $(2-3)^{th}$ opening OP2b that exposes at least a portion of the pixel electrode 210 of the second blue pixel PX2b. In this case, the $(2-1)^{th}$ opening OP2r may define a $(2-1)^{th}$ emission area EA2r, the $(2-2)^{th}$ opening OP2g may define a $(2-2)^{th}$ emission area EA2g, and the $(2-3)^{th}$ opening OP2b may define a $(2-3)^{th}$ emission area EA2b. The $(2-1)^{th}$ to $(2-3)^{th}$ emission areas EA2r, EA2g, and EA2b may correspond to areas in which red light, green light, and blue light is emitted, respectively.

Also, the pixel defining layer 119 may include a $(3-1)^{th}$ opening OP3r that exposes at least a portion of the pixel electrode 210 of the third red pixel PX3r, a $(3-2)^{th}$ opening OP3g that exposes at least a portion of the pixel electrode 210 of the third green pixel PX3g, and a $(3-3)^{th}$ opening OP3b that exposes at least a portion of the pixel electrode 210 of the third blue pixel PX3b. In this case, the $(3-1)^{th}$ opening OP3r may define a $(3-1)^{th}$ emission area EA3r, the $(3-2)^{th}$ opening OP3g may define a $(3-2)^{th}$ emission area EA3g, and the $(3-3)^{th}$ opening OP3b may define a $(3-3)^{th}$ emission area EA3b. The $(3-1)^{th}$ to $(3-3)^{th}$ emission areas EA3r, EA3g, and EA3b may correspond to areas in which red light, green light, and blue light is emitted, respectively.

According to an embodiment, the number of first red pixels PX1r per unit area in the first area AR1 may be greater than the number of second red pixels PX2r per unit area in the second area AR2. The above description has been made with respect to the first red pixels PX1r and the second red pixels PX2r, but the same may also apply to the first green pixels PX1g and the second green pixels PX2g, and the first blue pixels PX1b and the second blue pixels PX2b.

In other words, the number of the $(1-1)^{th}$ openings OP1r per unit area in the first area AR1 may be greater than the number of the $(2-1)^{th}$ openings OP2r per unit area in the second area AR2. The above description has been made with respect to the $(1-1)^{th}$ openings OP1r and the $(2-1)^{th}$ openings OP2r, but the same may also apply to the $(1-2)^{th}$ openings OP1g and the (2-2) openings OP2g, and the $(1-3)^{th}$ openings OP1b and the $(2-3)^{th}$ openings OP2b. As a result, the resolution of the first area AR1 may be higher than the resolution of the second area AR2.

According to an embodiment, in a plan view, the area of the $(1-1)^{th}$ openings OP1r in the first area AR1 may be greater than the area of the $(3-1)^{th}$ openings OP3r in the third area AR3. The above description has been made with respect to the $(1\text{-}1)^{th}$ openings OP1$r$ and the $(3\text{-}1)^{th}$ openings OP3$r$, but the same may also apply to the $(1\text{-}2)^{th}$ openings OP1$g$ and the $(3\text{-}2)$ openings OP3$g$, and the $(1\text{-}3)^{th}$ openings OP1$b$ and the $(3\text{-}3)^{th}$ openings OP3$b$.

In other words, the aperture ratio of the first red pixels PX1$r$ may be higher than the aperture ratio of the third red pixels PX3$r$. The above description has been made with respect to the first red pixels PX1$r$ and the third red pixels PX3$r$, but the same may also apply to the first green pixels PX1$g$ and the third green pixels PX3$g$, and the first blue pixels PX1$b$ and the third blue pixels PX3$b$.

In other words, the $(1\text{-}1)^{th}$ emission area EA1$r$ of the first red pixel PX1$r$ may be greater than the $(3\text{-}1)^{th}$ emission area EA3$r$ of the third red pixel PX3$r$. The above description has been made with respect to the $(1\text{-}1)^{th}$ emission area EA1$r$ and the $(3\text{-}1)^{th}$ emission area EA3$r$, but the same may also apply to the $(1\text{-}2)^{th}$ emission area EA1$g$ and the $(3\text{-}2)$ emission area EA3$g$, and the $(1\text{-}3)^{th}$ emission area EA1$b$ and the $(3\text{-}3)^{th}$ emission area EA3$b$.

Because the aperture of each of the first red pixels PX1$r$, the first green pixels PX1$g$, and the first blue pixels PX1$b$ is different from the aperture ratio of each of the third red pixels PX3$r$, the third green pixels PX3$g$, and the third blue pixels PX3$b$, the luminance of the first area AR1 may be different from the luminance of the third area AR3. In a case where the aperture of each of the first red pixels PX1$r$, the first green pixels PX1$g$, and the first blue pixels PX1$b$ is higher than the aperture ratio of each of the third red pixels PX3$r$, the third green pixels PX3$g$, and the third blue pixels PX3$b$, the luminance of the first area AR1 may be higher than the luminance of the third area AR3. As such, the third area AR3 having a luminance lower than that of the first area AR1 and greater than that of the second area AR2 may reduce the difference in resolution between the first area AR1 and the second area AR2. Therefore, an interface between the first area AR1 and the second area AR2 may be visually less recognizable to a user.

According to an embodiment, the third area AR3 may include a first portion AR3$a$ and a second portion AR3$b$. The first portion AR3$a$ of the third area AR3 may be adjacent to the first area AR1, and the second portion AR3$b$ of the third area AR3 may be adjacent to the second area AR2. Although FIG. 5A illustrates that the third area AR3 is divided into two portions including the first portion AR3$a$ and the second portion AR3$b$, the present disclosure is not limited thereto. For example, the third area AR3 may be divided into three or more portions.

According to an embodiment, the area of the $(3\text{-}1)^{th}$ openings OP3$r$ in the first portion AR3$a$ of the third area AR3 may be greater than the area of the $(3\text{-}1)^{th}$ opening OP3$r$ in the second portion AR3$b$ of the third area AR3. The above description has been made with respect to the $(3\text{-}1)^{th}$ openings OP3$r$, but the same may also apply to the $(3\text{-}2)^{th}$ openings OP3$g$ and the $(3\text{-}3)^{th}$ openings OP3$b$.

In other words, the $(3\text{-}1)^{th}$ emission areas EA3$r$ in the first portion AR3$a$ of the third area AR3 may be greater than the $(3\text{-}1)^{th}$ emission areas EA3$r$ in the second portion AR3$b$ of the third area AR3. The above description has been made with respect to the $(3\text{-}1)^{th}$ emission areas EA3$r$, but the same may also apply to the $(3\text{-}2)^{th}$ emission areas EA3$g$ and the $(3\text{-}3)^{th}$ emission areas EA3$b$.

In a plan view, the area of the $(3\text{-}1)^{th}$ openings OP3$r$ may gradually decrease in a direction from the first area AR1 to the second area AR2. The area of the $(3\text{-}1)^{th}$ openings OP3$r$ may gradually decrease as the distance to the second area AR2 decreases. For example, the area of the $(3\text{-}1)^{th}$ openings OP3$r$ may gradually decrease in the +x direction. The above description has been made with respect to the $(3\text{-}1)^{th}$ openings OP3$r$, but the same may also apply to the $(3\text{-}2)^{th}$ openings OP3$g$ and the $(3\text{-}3)^{th}$ openings OP3$b$.

In other words, the $(3\text{-}1)^{th}$ emission area EA3$r$ may gradually decrease in the +x direction from the first area AR1 to the second area AR2. The $(3\text{-}1)^{th}$ emission area EA3$r$ may gradually decrease as the distance to the second area AR2 decreases. The above description has been made with respect to the $(3\text{-}1)^{th}$ emission areas EA3$r$, but the same may also apply to the $(3\text{-}2)^{th}$ emission areas EA3$g$ and the $(3\text{-}3)^{th}$ emission areas EA3$b$.

In other words, the aperture ratio of each of the third red pixels PX3$r$, the third green pixels PX3$g$, and the third blue pixels PX3$b$ may gradually decrease in the +x direction from the first area AR1 to the second area AR2. The aperture ratio of each of the third red pixels PX3$r$, the third green pixels PX3$g$, and the third blue pixels PX3$b$ may gradually decrease as the distance to the second area AR2 decreases.

As described above, the aperture ratio of each of the third red pixels PX3$r$, the third green pixels PX3$g$, and the third blue pixels PX3$b$ that gradually decreases as the distance to the second area AR2 decreases may gradually decrease the luminance of the third area AR3 as the distance to the second area AR2 decreases.

As described above, the first area AR1 and the second area AR2 may have different resolutions from each other due to their different pixel arrangements. The third area AR3 arranged between the first area AR1 and the second area AR2 may reduce a difference in resolution and a difference in luminance between the first area AR1 and the second area AR2. As the luminance gradually decreases between the first area AR1 and the second area AR2, and an interface between the first area AR1 and the second area AR2 may be less recognizable to a user.

According to an embodiment, a width w1$r$ between the $(1\text{-}1)^{th}$ openings OP1$r$ adjacent to each other in the first direction (e.g., ±x direction) may be less than a width w2$r$ between the $(3\text{-}1)^{th}$ openings OP3$r$ adjacent to each other in the first direction.

On the other hand, a gap g1$r$ between the pixel electrodes 210 of the first red pixels PX1$r$ adjacent to each other in the first direction may be substantially equal to a gap g2$r$ between the pixel electrodes 210 of the third red pixels PX3$r$ adjacent to each other in the first direction.

According to an embodiment, a width w1$g$ between the $(1\text{-}2)^{th}$ openings OP1$g$ adjacent to each other in the first direction may be less than a width w2$g$ between the $(3\text{-}2)^{th}$ openings OP3$g$ adjacent to each other in the first direction.

On the other hand, a gap g1$g$ between the pixel electrodes 210 of the first green pixels PX1$g$ adjacent to each other in the first direction may be substantially equal to a gap g2$g$ between the pixel electrodes 210 of the third green pixels PX3$g$ adjacent to each other in the first direction.

According to an embodiment, a width w1$b$ between the $(1\text{-}3)^{th}$ openings OP1$b$ adjacent to each other in the first direction may be less than a width w2$b$ between the $(3\text{-}3)^{th}$ openings OP3$b$ adjacent to each other in the first direction.

On the other hand, a gap g1$b$ between the pixel electrodes 210 of the first blue pixels PX1$b$ adjacent to each other in the first direction may be substantially equal to a gap g2$b$ between the pixel electrodes 210 of the third blue pixels PX3$b$ adjacent to each other in the first direction.

The description has been made with respect to the first direction (e.g., ±x direction), but the same may also apply to the second direction (e.g., ±y direction).

The sizes and arrangements of the pixel electrodes 210 respectively arranged in the first area AR1 and the third area AR3 may be substantially the same as each other, but the areas in which the pixel electrodes 210 are exposed by the pixel defining layer 119 may be different from each other for each region. The area of a portion of the pixel electrode 210 that is exposed by the pixel defining layer 119 in the first area AR1 may be greater than the area of a portion of the pixel electrode 210 that is exposed by the pixel defining layer 119 in the third area AR3. In other words, the area in which the pixel electrode 210 and the pixel defining layer 119 overlap each other in the first area AR1 may be less than the area in which the pixel electrode 210 and the pixel defining layer 119 overlap each other in the third area AR3.

According to an embodiment, a width w2ra between the (3-1)$^{th}$ openings OP3r adjacent to each other in the first portion AR3a of the third area AR3 may be less than a width w2rb between the (3-1)$^{th}$ openings OP3r adjacent to each other in the second portion AR3b of the third area AR3.

According to an embodiment, a width w2ga between the (3-2)$^{th}$ openings OP3g adjacent to each other in the first portion AR3a of the third area AR3 may be less than a width w2gb between the (3-2)$^{th}$ openings OP3g adjacent to each other in the second portion AR3b of the third area AR3.

According to an embodiment, a width w2ba between the (3-3)$^{th}$ openings OP3b adjacent to each other in the first portion AR3a of the third area AR3 may be less than a width w2bb between the (3-3)$^{th}$ openings OP3b adjacent to each other in the second portion AR3b of the third area AR3.

That is, the aperture ratio of each of the third red pixels PX3r, the third green pixels PX3g, and the third blue pixels PX3b may gradually decrease in the +x direction from the first area AR1 to the second area AR2 as the distance to the second area AR2 decreases.

Figure 6:
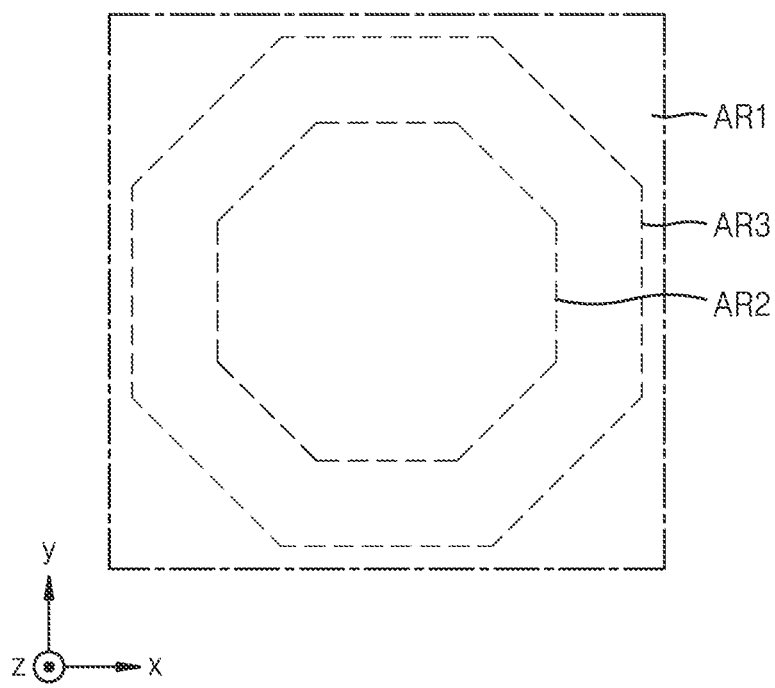
FIG. 6 is an enlarged plan view of a portion of FIG. 1.

FIG. 6 is an enlarged plan view of a portion of FIG. 1.

Referring to FIG. 6, the second area AR2 may be arranged inside the first area AR1, and the second area AR2 may be completely surrounded by the first area AR1. The third area AR3 may be arranged between the first area AR1 and the second area AR2.

The pixels arranged in each of the first to third areas AR1, AR2, and AR3 may be the same as described above with reference to FIGS. 3A to 5B. As in some embodiments described above with reference to FIGS. 3A to 5B, the pixels arranged in the third area AR3 have a size that gradually decreases from the first area AR1 toward the second area AR2. As a result, an interface between the first area AR1 and the second area AR2 may be visually less recognizable to a user, and the display uniformity and the display quality of the display apparatus 1 may be improved.

The pixels arranged in each of the first to third areas AR1, AR2, and AR3 may be the same as those of FIGS. 7A to 10 to be described later. In these cases, the display uniformity and the display quality of the display apparatus 1 may be improved.

Figure 7B:
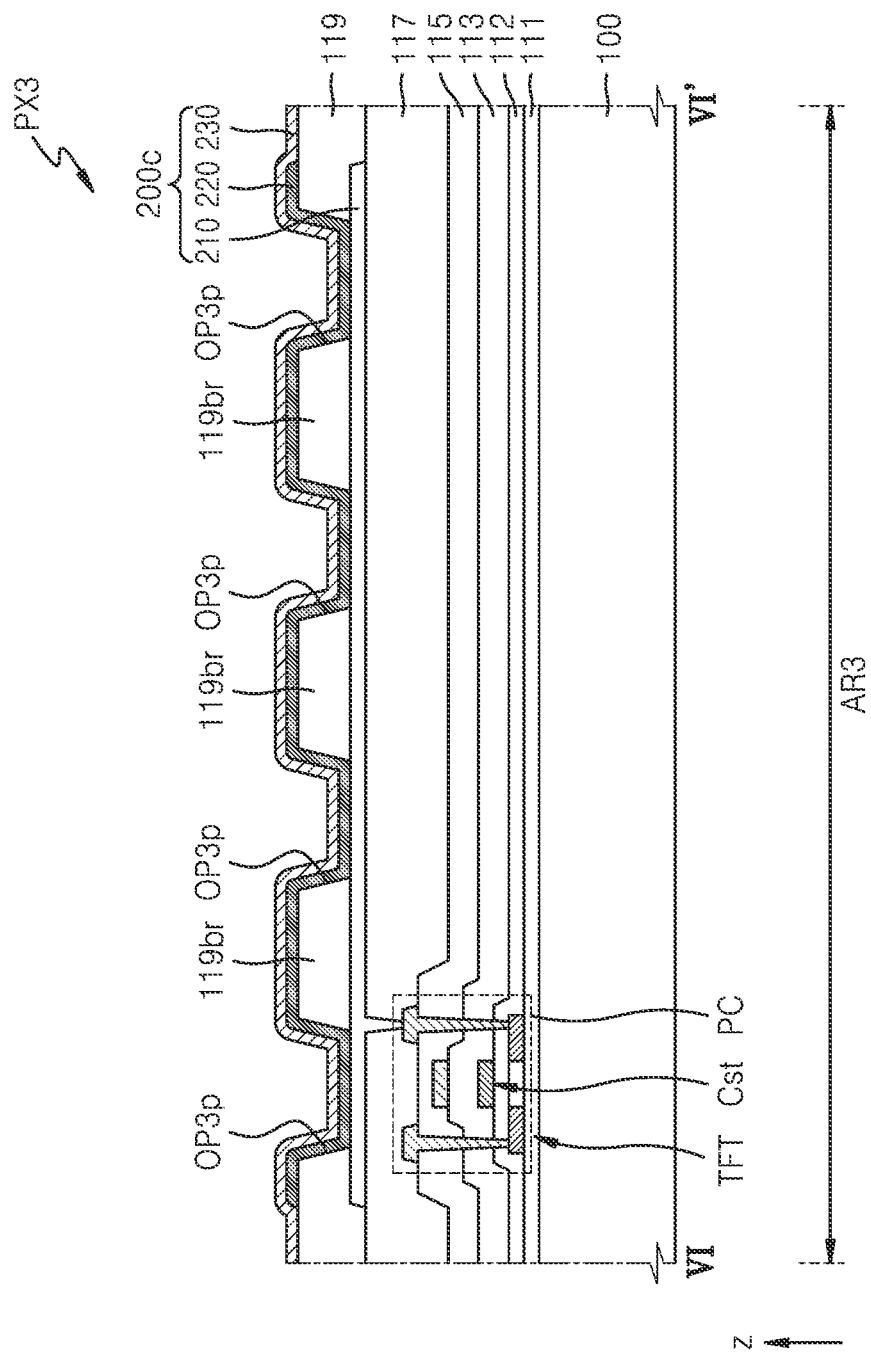
FIG. 7B is a cross-sectional view of a third area taken along line VI-VI' of FIG. 7A.

FIG. 7A is an enlarged plan view of a portion (i.e., region I) of the display apparatus 1, according to another embodiment, and FIG. 7B is a cross-sectional view of a third area taken along line VI-VI' of FIG. 7A. In FIGS. 7A and 7B, the same reference numerals as those in FIGS. 3A to 3C denote the same members, and redundant descriptions thereof may be omitted. Also, FIG. 7A illustrates a modification to the embodiment of FIG. 3A, and there is a difference in a structure of the third pixel PX3 in the third area AR3. Hereinafter, description previously given with respect to FIG. 3A is omitted, and the differences will be mainly described.

Referring to FIG. 7A, the display apparatus 1 may include a first area AR1, a second area AR2, and a third area AR3 that is arranged between the first area AR1 and the second area AR2. First pixels PX1 may be arranged in the first area AR1, second pixels PX2 may be arranged in the second area AR2, and third pixels PX3 may be arranged in the third area AR3. Transmission areas TA may be arranged in the second area AR2 between the neighboring second pixels PX2, respectively.

First openings OP1 may be in the first area AR1, second openings OP2 may be in the second area AR2, and third openings OP3 may be in the third area AR3. The first opening OP1 may define a first emission area EA1 of the first pixel PX1, the second opening OP2 may define a second emission area EA2 of the second pixel PX2, and the third opening OP3 may define a third emission area EA3 of the third pixel PX3.

According to an embodiment, each of the third openings OP3 in the third area AR3 may include a plurality of partial openings OP3p.

Referring to FIG. 7B, a pixel electrode 210 may be partially exposed by the partial openings OP3p. The pixel electrode 210 may include portions that are partially exposed by the partial openings OP3p. In other words, the partial openings OP3p may expose at least a portion of the pixel electrode 210. A pixel defining layer 119 may include the partial openings OP3p that respectively expose at least a portion of the pixel electrode 210.

FIGS. 7A and 7B illustrate that the third opening OP3 includes four partial openings OP3p, but this is only an example, and the number of partial openings OP3p included in the third opening OP3 may be variously changed without deviating from the scope of the present disclosure. For example, the number of partial openings OP3p included in the third opening OP3 may be two, three, or five or more.

Branches 119br may be arranged between the partial openings OP3p that are adjacent to each other. As illustrated in FIG. 7A, a plurality of third openings OP3 may provide a plurality of branches 119br. That is, the branches 119br may be arranged to correspond to the third openings OP3, respectively.

Referring back to FIG. 7B, an intermediate layer 220 may be arranged on the pixel electrode 210. The intermediate layer 220 may overlap the partial openings OP3p and the branches 119br. The intermediate layer 220 may be formed as a single layer without being separated in the third pixel PX3. This is only an example, and the intermediate layer 220 may be arranged in each of the partial openings OP3p in another example. In this case, the intermediate layer 220 may be separated in the third pixel PX3 and arranged in each of the partial openings OP3p.

The branch 119br may include an organic insulating material such as polyimide. Alternatively, the branch 119br may include an inorganic insulating material such as silicon nitride or silicon oxide, or may include an organic insulating material and an inorganic insulating material.

The branch 119br may include the same material as that of the pixel defining layer 119. In this case, as illustrated in FIG. 7A, the branch 119br may be integrally formed with the pixel defining layer 119. That is, the branch 119br may correspond to a portion of the pixel defining layer 119, and the pixel defining layer 119 may include the branch 119br.

As illustrated in FIG. 7A, the pixel electrode 210 in the third area AR3 may include a center ce. The centers ce of the pixel electrodes 210 may overlap the branches 119br in the third area AR3.

The partial openings OP3*p* included in each of the third pixels PX3 may lower the aperture ratio of the third pixels PX3. Because the branch 119*br* between the partial openings OP3*p* partially overlaps the pixel electrode 210, the third emission area EA3 may be less than the first emission area EA1. Therefore, the aperture ratio of the third pixels PX3 may be lower than the aperture ratio of the first pixels PX1.

Because the aperture ratio of the first pixels PX1 is higher than the aperture ratio of the third pixels PX3, the luminance of the first area AR1 may be higher than the luminance of the third area AR3. In this case, for the same signal corresponding to a first gray scale value being input, the amount of first color light emitted from the first pixels PX1 may be greater than the amount of first color light emitted from the third pixels PX3. As such, the third area AR3 having a luminance lower than that of the first area AR1 and greater than that of the second area AR2 may reduce the difference in resolution between the first area AR1 and the second area AR2. Therefore, an interface between the first area AR1 and the second area AR2 may be visually less recognizable to a user.

Although FIG. 7A illustrates that the width of the branch 119*br* is constant, this is only an example. In another example, the width of the branch 119*br* may be variously changed. This will be described with reference to FIG. 8.

FIG. 8 is an enlarged plan view of a portion (i.e., region I) of the display apparatus 1, according to another embodiment. FIG. 8 illustrates a modification to the embodiment of FIG. 7A. Hereinafter, description previously given with respect to FIG. 3A is omitted, and the differences will be mainly described.

As described above with reference to FIG. 7A, each of the third openings OP3 in the third area AR3 may include a plurality of partial openings OP3*p*. Branches 119*br* may be arranged between the partial openings OP3*p*.

Referring to FIG. 8, a width wd of the branch 119*br* may gradually increase in the +x direction from the first area AR1 to the second area AR2. The width wd of the branch 119*br* may gradually increase from the first area AR1 toward the second area AR2.

A first branch 119*br*1, a second branch 119*br*2, a third branch 119*br*3, a fourth branch 119*br*4, and a fifth branch 119*br*5 may be arranged in the third area AR3. A second width wd2 of the second branch 119*br*2 adjacent to the first branch 119*br*1 in the +x direction may be greater than a first width wd1 of the first branch 119*br*1. A third width wd3 of the third branch 119*br*3 adjacent to the second branch 119*br*2 in the +x direction may be greater than the second width wd2 of the second branch 119*br*2. A fourth width wd4 of the fourth branch 119*br*4 adjacent to the third branch 119*br*3 in the +x direction may be greater than the third width wd3 of the third branch 119*br*3. A fifth width wd5 of the fifth branch 119*br*5 adjacent to the fourth branch 119*br*4 in the +x direction may be greater than the fourth width wd4 of the fourth branch 119*br*4. The first width wd1 of the first branch 119*br*1 closest to the first area AR1 may be the smallest, and the fifth width wd5 of the fifth branch 119*br*5 closest to the second area AR2 may be the largest.

As such, the width wd of the branch 119*br* may gradually increase from the first area AR1 toward the second area AR2, and the sizes of the third pixels PX3 arranged in the third area AR3 gradually decrease from the first area AR1 toward the second area AR2. In this case, an interface between the first area AR1 and the second area AR2 may be visually less recognizable to a user.

Figure 9A:
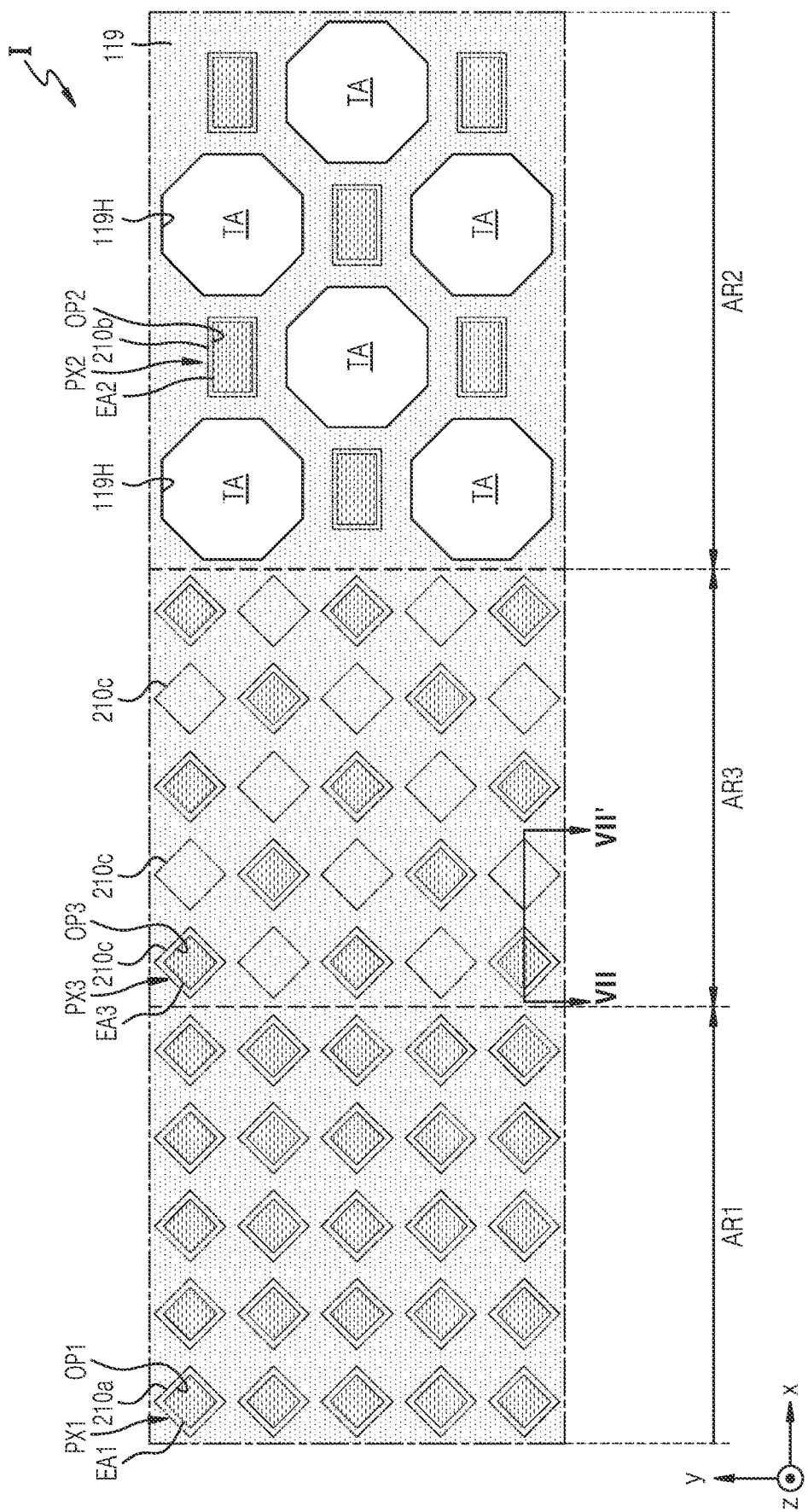
FIG. 9A is an enlarged plan view of a portion of a display apparatus, according to another embodiment.
Figure 9B:
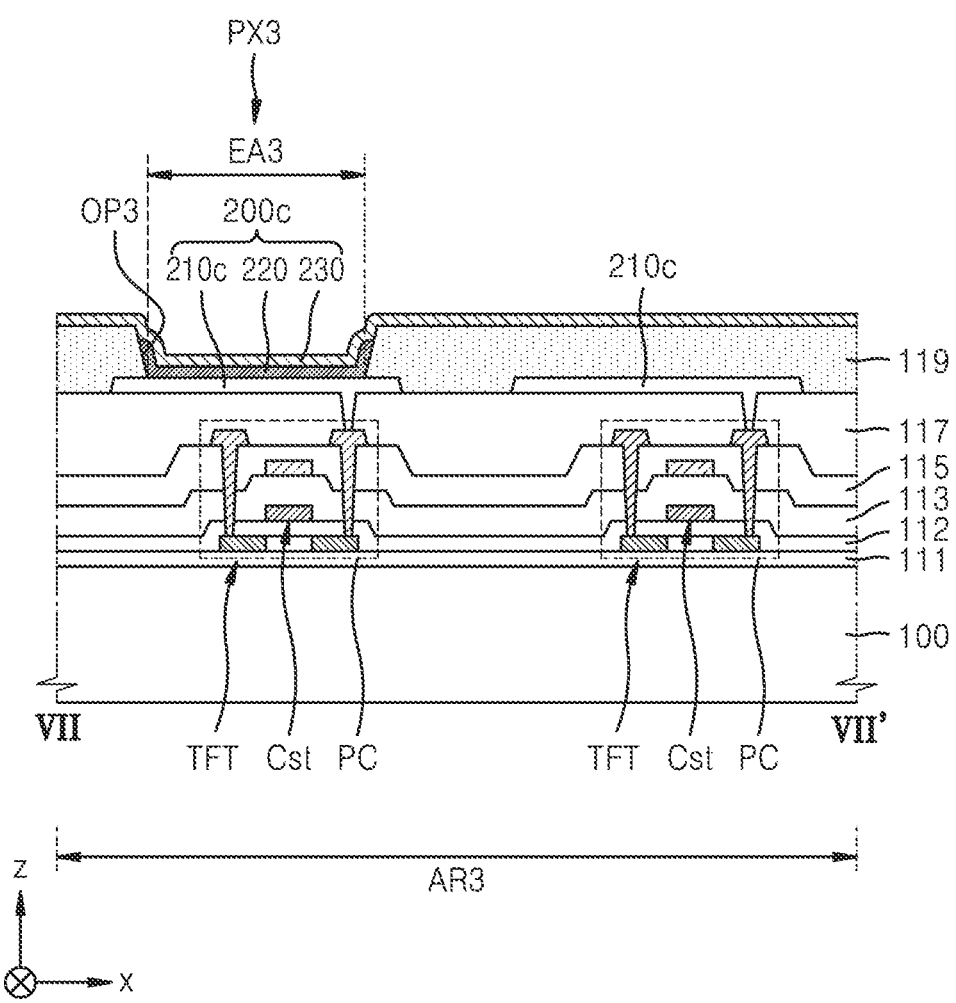
FIG. 9B is a cross-sectional view of a third area taken along line VII-VII' of FIG. 9A.

FIG. 9A is an enlarged plan view of a portion (i.e., region I) of the display apparatus 1, according to another embodiment, and FIG. 9B is a cross-sectional view of a third area taken along line VII-VII' of FIG. 9A.

Referring to FIG. 9A, the display apparatus 1 may include a first area AR1, a second area AR2, and a third area AR3 that is arranged between the first area AR1 and the second area AR2.

A plurality of first pixel electrodes 210*a* may be arranged in the first area AR1, a plurality of second pixel electrodes 210*b* may be arranged in the second area AR2, and a plurality of third pixel electrodes 210*c* may be arranged in the third area AR3. The first pixel electrodes 210*a* may correspond to the pixel electrodes 210 in the first area AR1 of FIG. 3A, respectively, the second pixel electrodes 210*b* may correspond to the pixel electrodes 210 in the second area AR2 of FIG. 3A, respectively, and the third pixel electrodes 210*c* may respectively correspond to the pixel electrodes 210 in the third area AR3 of FIG. 3A. Each of the first pixel electrodes 210*a*, the second pixel electrodes 210*b*, and the third pixel electrode 210*c* may be electrically connected to a corresponding pixel circuit PC (see FIGS. 3B and 3C).

A pixel defining layer 119 may include first openings OP1 that exposes at least portions of the first pixel electrodes 210*a* and second openings OP2 that exposes at least portions of the second pixel electrodes 210*b*.

According to an embodiment, the pixel defining layer 119 may cover at least one of the third pixel electrodes 210*c*. The pixel defining layer 119 may be arranged to overlap at least one of the third pixel electrodes 210*c* in the third area AR3. Also, the pixel defining layer 119 may include third openings OP3 that exposes at least portions of the third pixel electrodes 210*c* other than the third pixel electrodes 210*c* that is covered with the pixel defining layer 119 among the third pixel electrodes 210*c* in the third area AR3. An intermediate layer 220 may be arranged in the third opening OP3.

That is, as illustrated in FIG. 9B, at least one of the third pixel electrodes 210*c* may be covered with the pixel defining layer 119, and at least one of the third pixel electrodes 210*c* may overlap the pixel defining layer 119. The upper surface and the side surface of the at least one of the third pixel electrodes 210*c* may be in direct contact with the pixel defining layer 119.

According to an embodiment, in a plan view, the area of the first openings OP1 in the first area AR1 may be substantially equal to the area of the third openings OP3 in the third area AR3. In other words, the first emission area EA1 of the first pixel PX1 in the first area AR1 may be substantially equal to the third emission area EA3 of the third pixel PX3 in the third area AR3.

According to an embodiment, the number of first pixel electrodes 210*a* per unit area in the first area AR1 may be substantially equal to the number of third pixel electrodes 210*c* per unit area in the third area AR3.

The number of first pixel electrodes 210*a*, at least a portion of which is exposed, per unit area may be greater than the number of third pixel electrodes 210*c*, at least a portion of which is exposed, per unit area. That is, the number of first openings OP1 per unit area in the first area AR1 may be greater than the number of third openings OP3 per unit area in the third area AR3. In other words, the number of first pixels PX1 per unit area in the first area AR1 may be greater than the number of third pixels PX3 per unit area in the third area AR3.

As such, while the number of third pixel electrodes 210*c* arranged in the third area AR3 per unit area is equal to the number of first pixel electrodes 210*a* arranged in the first area AR1 per unit area, the number of third openings OP3 per unit area may be less than the number of first openings OP1 per unit area. That is, the pixel density in the third area AR3 may be lower than the pixel density in the first area AR1. Accordingly, the luminance of the third area AR3 may be lower than the luminance of the first area AR1.

Because the third area AR3 having a luminance lower than that of the first area AR1 is arranged between the first area AR1 and the second area AR2, the difference in resolution and the difference in luminance between the first area AR1 and the second area AR2 may be reduced. Therefore, an interface between the first area AR1 and the second area AR2 may be visually less recognizable to a user.

FIG. 9A illustrates that some of the third pixel electrodes 210c that are covered with the pixel defining layer 119 and some of the third pixel electrodes 210c that are partially exposed by the third openings OP3 are alternately arranged in the third area AR3, but this is only an example, and the arrangement structure of the third pixel electrodes 210c may be variously changed.

FIG. 9A illustrates that the pixel density in the third area AR3 is uniform, but this is only an example, and the pixel density in the third area AR3 may be variously changed. For example, as described with reference to FIG. 10, the pixel density in the third area AR3 may gradually decrease as the distance to the second area AR2 decreases.

Figure 10:
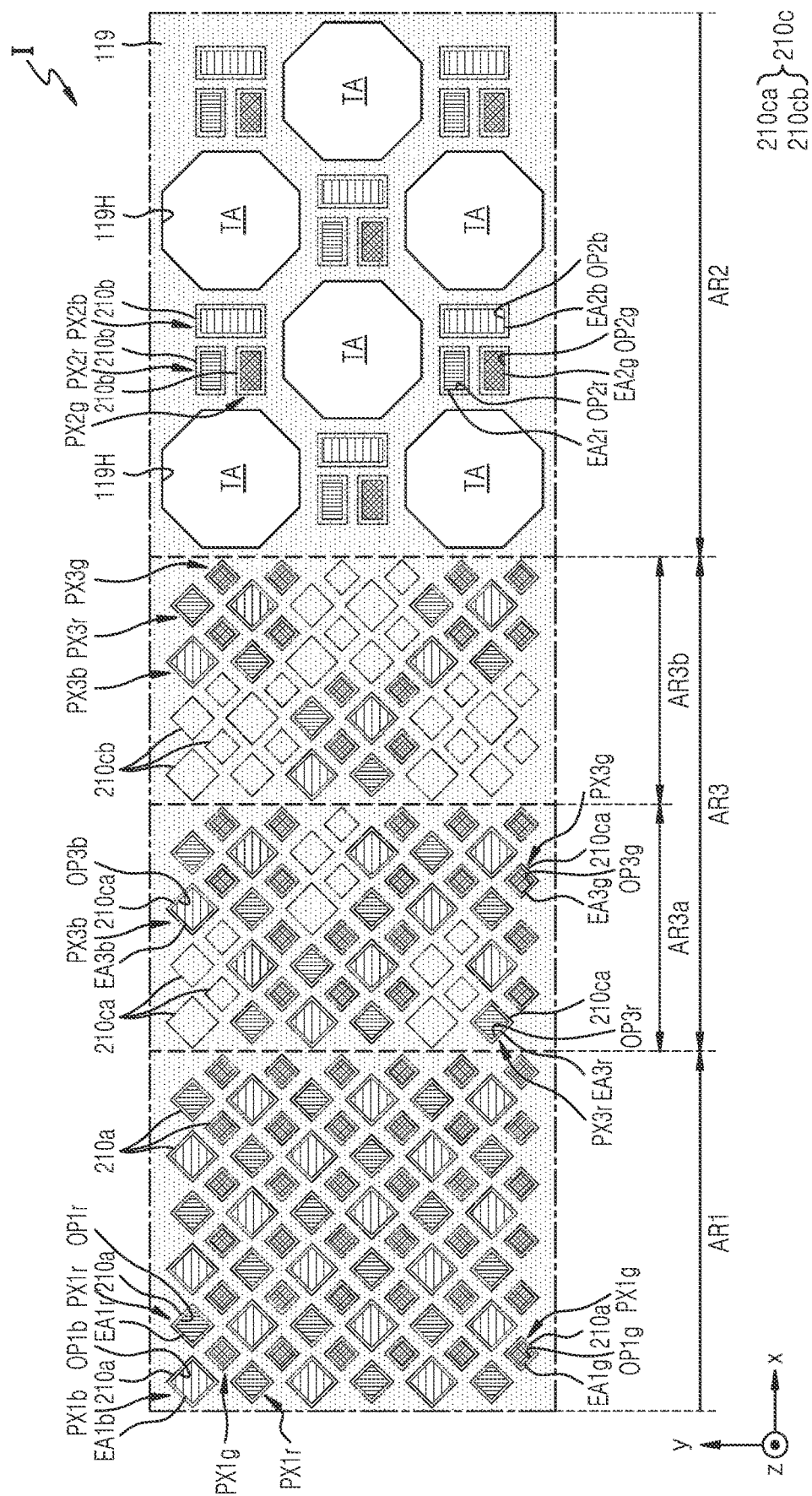
FIG. 10 is an enlarged plan view of a portion of a display apparatus, according to another embodiment.

FIG. 10 is an enlarged plan view of a portion (i.e., region I) of the display apparatus 1, according to another embodiment. FIG. 10 illustrates a modification to the embodiments of FIGS. 5 and 9A. Hereinafter, description previously given with respect to FIGS. 5 and 9A is omitted, and the differences will be mainly described.

Referring to FIG. 10, first pixel electrodes 210a may be arranged in a first area AR1, second pixel electrodes 210b may be arranged in a second area AR2, and third pixel electrodes 210c may be arranged in a third area AR3. The first pixel electrodes 210a may have different sizes from each other in the first area AR1, the second pixel electrodes 210b may have different sizes from each other in the second area AR2, and the third pixel electrodes 210c may have different sizes from each other in the third area AR3.

Each of first red pixels PX1r, first green pixels PX1g, and first blue pixels PX1b may include the first pixel electrode 210a. Each of second red pixels PX2r, second green pixels PX2g, and second blue pixels PX2b may include the second pixel electrode 210b. Each of third red pixels PX3r, third green pixels PX3g, and third blue pixels PX3b may include the third pixel electrode 210c.

The third area AR3 may include a first portion AR3a and a second portion AR3b. The third pixel electrodes 210c arranged in the first portion AR3a of the third area AR3 may be referred to as (3-1)$^{th}$ pixel electrodes 210ca, and the third pixel electrodes 210c arranged in the second portion AR3b of the third area AR3 may be referred to as (3-2)$^{th}$ pixel electrodes 210cb.

According to an embodiment, a pixel defining layer 119 may cover at least one of the third pixel electrodes 210c. The number of the (3-2)$^{th}$ pixel electrodes 210cb that are covered with the pixel defining layer 119 per unit area in the second portion AR3b of the third area AR3 may be greater than the number of the (3-1)$^{th}$ pixel electrodes 210ca that are covered with the pixel defining layer 119 per unit area in the first portion AR3a of the third area AR3.

That is, the number of third pixel electrodes 210c that are covered with the pixel defining layer 119 per unit area may gradually increase from the first area AR1 toward the second area AR2. In contrast, the number of third openings OP3 per unit area may gradually decrease from the first area AR1 toward the second area AR2.

Figure 11:
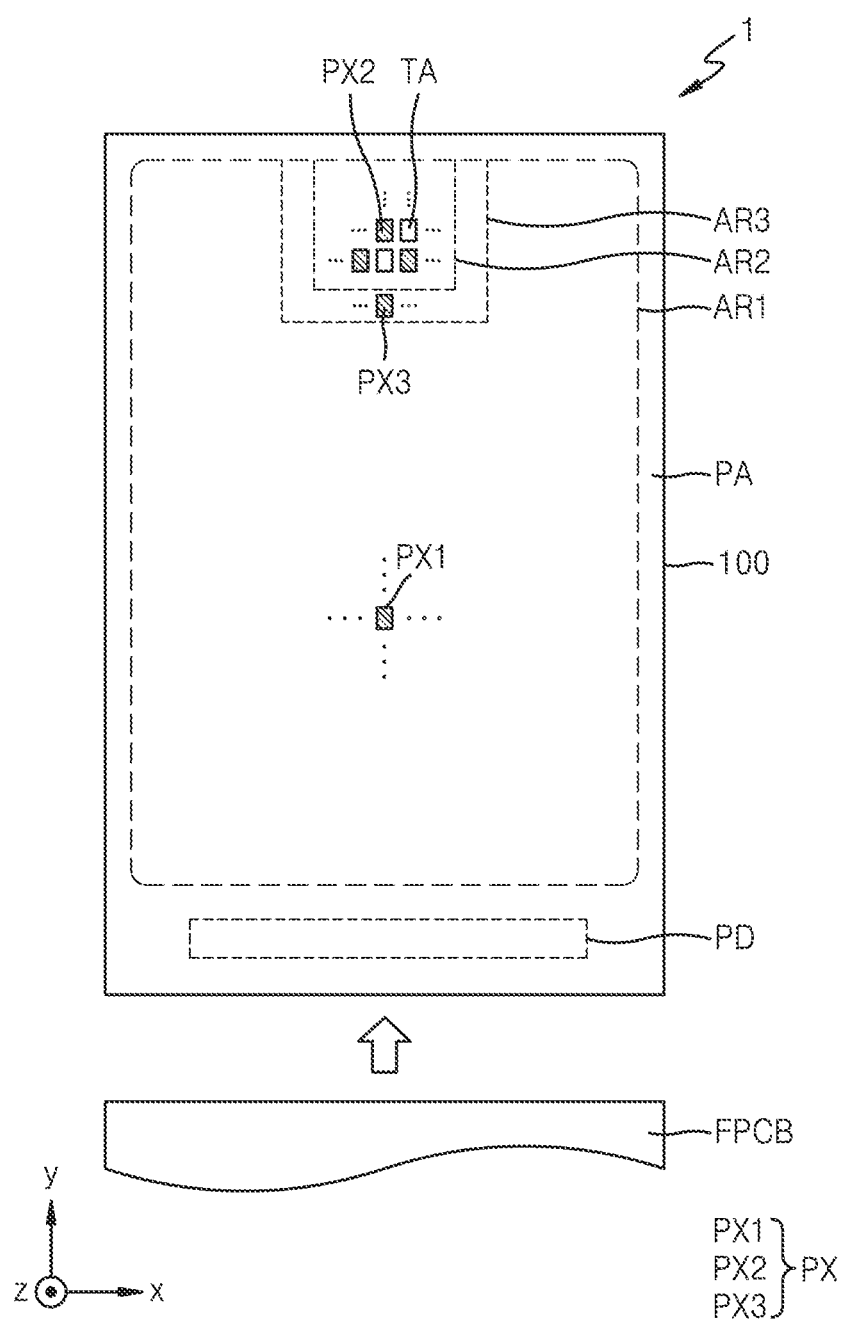
FIG. 11 is a plan view of a display apparatus according to another embodiment.
Figure 12:
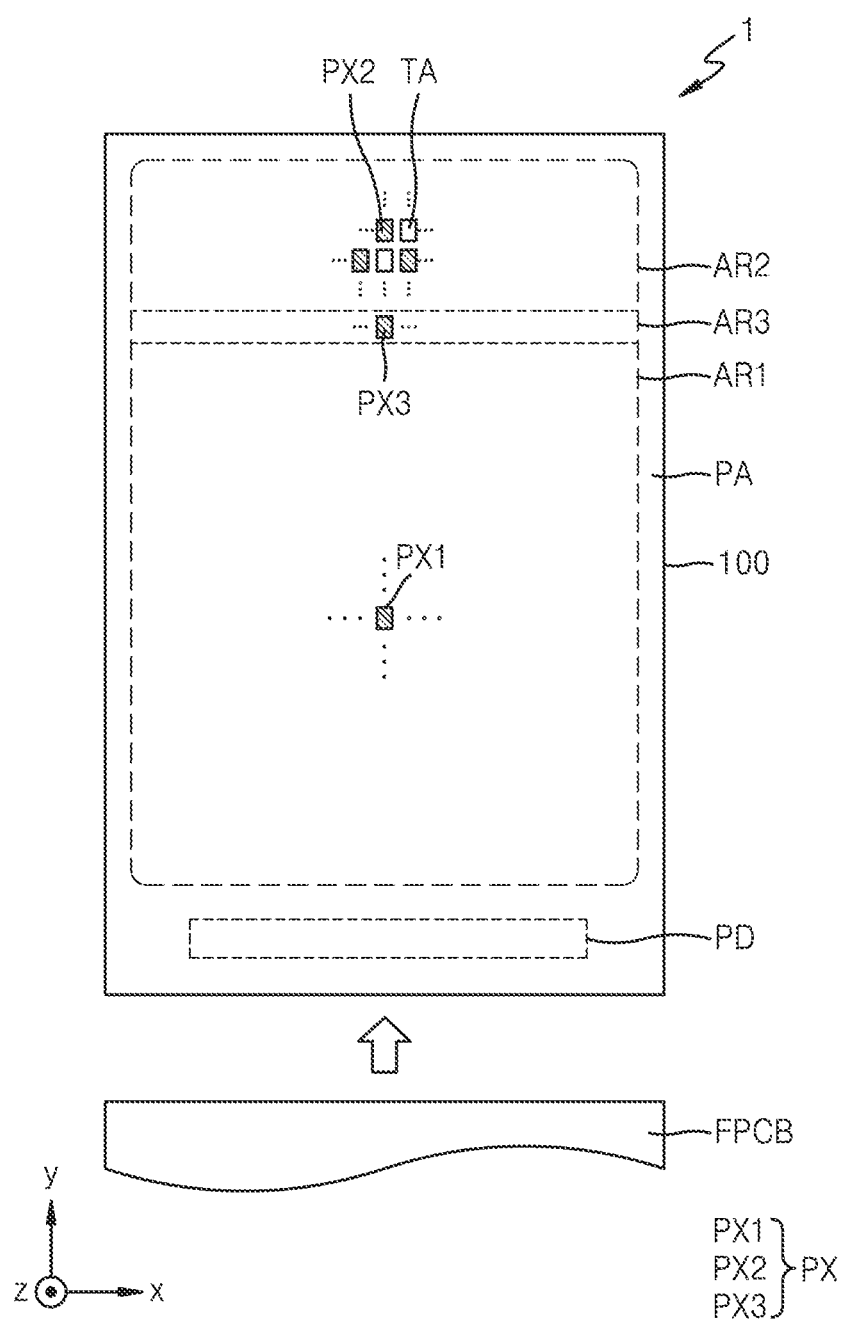
FIG. 12 is a plan view of a display apparatus according to yet another embodiment.

FIG. 11 is a plan view of the display apparatus 1 according to another embodiment, and FIG. 12 is a plan view of the display apparatus 1 according to yet another embodiment. In FIGS. 11 and 12, the same reference numerals as those in FIG. 1 denote the same members, and redundant descriptions thereof may be omitted. FIGS. 11 and 12 illustrate a modification to the embodiment of FIG. 1. Hereinafter, description previously given with respect to FIG. 1 is omitted, and the differences will be mainly described.

Referring to FIGS. 11 and 12, a second area AR2 may be partially surrounded by a first area AR1. For example, some edges of the second area AR2 may be adjacent to the first area AR1, and the other edges thereof may be adjacent to a peripheral area PA.

As illustrated in FIG. 11, the planar shape of the second area AR2 may be rectangular. One of the edges of the second area AR2 may be adjacent to the peripheral area PA, and the other edges thereof may be adjacent to the first area AR1. In contrast, as illustrated in FIG. 12, one of the edges of the second area AR2 may be adjacent to the first area AR1, and the other edges thereof may be adjacent to the peripheral area PA.

In this case, the third area AR3 may be arranged between the first area AR1 and the second area AR2, and the third pixels PX3 in the third area AR3 may be arranged at a density between the density in the first pixels PX1 and the density in the second pixels PX2. The third pixels PX3 arranged between the first pixels PX1 and the second pixels PX2 that have different densities from each other may reduce visual recognition of an interface between the first area AR1 and the second area AR2.

From the foregoing, the display apparatus has been mainly described, but the present disclosure is not limited thereto. For example, it will be understood that a method of manufacturing the display apparatus also falls within the scope of the present disclosure.

The present disclosure has been described with reference to some embodiments with reference to the drawings, but those of ordinary skill in the art will appreciate that various modifications and equivalents may be made thereto without deviating from the scope of the present disclosure.

According to the embodiments of the present disclosure, the density (e.g., number or aperture ratio) of pixels may be controlled by the openings of the insulating layer. The density of pixels may be controlled to prevent or minimize visual recognition of an interface between a first area and a second area that have different pixel arrangements from each other. However, the scope of the present disclosure is not limited thereto.

It should be understood that the embodiments described herein should be understood in a descriptive sense and not for purposes of limitation. Descriptions of features or aspects within one embodiment should typically be considered as readily available for other similar features or aspects in another embodiment. While some embodiments have been described with reference to the drawings, it will be understood by those of ordinary skill in the art that various changes in form and details may be made therein without departing from the spirit and scope of the present disclosure including the following claims.

What is claimed is:

1. A display apparatus comprising:
   a substrate comprising a first area, a second area, and a third area that is between the first area and the second area;
   a plurality of display elements comprising a plurality of first display elements arranged in the first area, a plurality of second display elements arranged in the second area, and a plurality of third display elements arranged in the third area, each of the plurality of display elements comprising a pixel electrode, a first intermediate layer, and an opposite electrode; and
   an insulating layer comprising a plurality of openings that comprises a plurality of first openings, a plurality of second openings, and a plurality of third openings that respectively expose at least portions of a plurality of pixel electrodes of the plurality of first display elements, the plurality of second display elements, and the plurality of third display elements,
   wherein a number of the plurality of first openings is greater than a number of the plurality of second openings per unit area, and,
   wherein in a plan view, an area of the plurality of first openings is greater than an area of the plurality of third openings.

2. The display apparatus of claim 1, wherein a first width of a first portion of the insulating layer between the plurality of first openings adjacent to each other in a direction is less than a second width of a second portion of the insulating layer between the plurality of third openings adjacent to each other in the direction.

3. The display apparatus of claim 2, wherein a first gap between the plurality of pixel electrodes of the plurality of first display elements adjacent to each other in the direction is substantially equal to a second gap between the plurality of pixel electrodes of the plurality of third display elements adjacent to each other in the direction.

4. The display apparatus of claim 1, wherein the third area comprises a first portion and a second portion,
   wherein, in the plan view, an area of $(3-1)^{th}$ openings in the first portion of the third area is greater than an area of $(3-2)^{th}$ openings in the second portion of the third area, and
   wherein the second portion of the third area is closer to the second area than the first portion of the third area.

5. The display apparatus of claim 1, wherein, in the plan view, an area of the plurality of third openings gradually decreases from the first area toward the second area.

6. The display apparatus of claim 1, wherein each of the plurality of third openings comprises a plurality of partial openings, and
   wherein the insulating layer comprises a plurality of branches between the plurality of partial openings.

7. The display apparatus of claim 6, wherein centers of the plurality of pixel electrodes of the plurality of third display elements respectively overlap the plurality of branches.

8. The display apparatus of claim 6, wherein, in the plan view, a width of the plurality of branches gradually increases from the first area toward the second area.

9. The display apparatus of claim 1, wherein the plurality of display elements further comprises a plurality of fourth display elements arranged in the first area and a plurality of fifth display elements arranged in the third area,
   wherein each of the plurality of fourth display elements and the plurality of fifth display elements includes the pixel electrode, a second intermediate layer configured to emit light of a second color that is different from a first color that the first intermediate layer emits, and the opposite electrode,
   wherein the plurality of first display elements and the plurality of fourth display elements are alternately arranged in the first area in a direction, and
   wherein the plurality of third display elements and the plurality of fifth display elements are alternately arranged in the third area in the direction.

10. The display apparatus of claim 9, wherein the plurality of openings further comprises a plurality of fourth openings and a plurality of fifth openings that respectively expose at least portions of the plurality of pixel electrodes of the plurality of fourth display elements and the plurality of fifth display elements, and,
    wherein in the plan view, an area of the plurality of fourth openings is greater than an area of the plurality of fifth openings.

11. The display apparatus of claim 10, wherein, in the plan view, an area of the plurality of fifth openings gradually decreases from the first area toward the second area.

12. The display apparatus of claim 1, wherein, in the second area, the insulating layer further comprises a plurality of holes that exposes at least a portion of the substrate.

13. The display apparatus of claim 12, wherein the plurality of holes is respectively arranged between the plurality of second openings adjacent to each other.

14. The display apparatus of claim 1, wherein the insulating layer comprises chromium (Cr), chromium oxide ($Cr_xO_y$), $Cr/Cr_xO_y$, $Cr/Cr_xO_y$/chromium nitride ($CrN_y$), a carbon pigment, a red/green/blue (RGB)-mixed pigment, graphite, a non-Cr-based pigment, a lactam-based pigment, or a perylene-based pigment.

15. A display apparatus comprising:
    a substrate comprising a first area, a second area, and a third area that is between the first area and the second area;
    a plurality of pixel circuits arranged in the first area, the second area, and the third area;
    a plurality of pixel electrodes electrically connected to the plurality of pixel circuits and comprising a plurality of first pixel electrodes in the first area, a plurality of second pixel electrodes in the second area, and a plurality of third pixel electrodes in the third area;
    an insulating layer comprising a plurality of openings that comprises a plurality of first openings and a plurality of second openings that respectively expose at least portions of the plurality of first pixel electrodes and the plurality of second pixel electrodes and arranged to cover at least one of the plurality of third pixel electrodes;
    an intermediate layer arranged in the plurality of first openings and the plurality of second openings; and
    an opposite electrode arranged on the intermediate layer,
    wherein a number of the plurality of first openings is greater than a number of the plurality of second openings per unit area.

16. The display apparatus of claim 15, wherein the insulating layer further comprises a plurality of third openings that exposes at least portions of the plurality of third pixel electrodes and covers other portions of the plurality of third pixel electrodes, and,
    wherein in a plan view, an area of the plurality of first openings is substantially equal to an area of the plurality of third openings.

17. The display apparatus of claim 15, wherein a number of the plurality of first pixel electrodes is substantially equal to a number of the plurality of third pixel electrodes per unit area.

18. The display apparatus of claim 15, wherein the third area comprises a first portion and a second portion,
  wherein a number of the plurality of third pixel electrodes covered by the insulating layer in the second portion of the third area is greater than a number of the plurality of third pixel electrodes covered by the insulating layer in the first portion of the third area per unit area, and
  wherein the second portion of the third area is closer to the second area than the first portion of the third area.

19. The display apparatus of claim 15, wherein a number of the plurality of third pixel electrodes covered by the insulating layer per unit area gradually increases from the first area toward the second area.

20. The display apparatus of claim 15, wherein, in the second area, the insulating layer comprises a plurality of holes that exposes at least a portion of the substrate, and
  wherein the plurality of holes is respectively arranged between the plurality of second openings adjacent to each other.

\* \* \* \* \*